United States Patent
Yang

(10) Patent No.: US 11,984,169 B2
(45) Date of Patent: *May 14, 2024

(54) PIECEWISE LINEAR AND TRIMMABLE TEMPERATURE SENSOR

(71) Applicant: MACRONIX INTERNATIONAL CO., LTD., Hsinchu (TW)

(72) Inventor: Yih-Shan Yang, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/142,423

(22) Filed: May 2, 2023

(65) Prior Publication Data
US 2023/0268011 A1    Aug. 24, 2023

Related U.S. Application Data

(63) Continuation of application No. 17/205,836, filed on Mar. 18, 2021, now Pat. No. 11,676,669.

(51) Int. Cl.
*G11C 16/04* (2006.01)
*G11C 16/30* (2006.01)

(52) U.S. Cl.
CPC .......... *G11C 16/30* (2013.01); *G11C 16/0483* (2013.01); *G01K 2217/00* (2013.01)

(58) Field of Classification Search
CPC ............... G11C 16/30; G11C 16/0483; G11C 29/12005; G11C 2029/4002; G11C 5/147; G11C 7/04; G11C 29/021; G11C 29/028; G01K 2217/00; G01K 7/00; G06F 11/3037; G06F 11/3058

USPC ..................................................... 365/185.18
See application file for complete search history.

(56) References Cited

U.S. PATENT DOCUMENTS

| | | | | |
|---|---|---|---|---|
| 7,859,918 B1* | 12/2010 | Nguyen | .................. | G05F 3/242 365/210.1 |
| 7,907,462 B2* | 3/2011 | Byeon | ...................... | G11C 7/04 327/512 |
| 7,969,795 B2* | 6/2011 | Lee | ......................... | G11C 5/145 365/189.09 |
| 2005/0063120 A1 | 3/2005 | Sinha et al. | | |
| 2010/0061160 A1 | 3/2010 | Jeong | | |
| 2010/0253317 A1* | 10/2010 | Okuno | ..................... | G11C 8/10 257/500 |

(Continued)

FOREIGN PATENT DOCUMENTS

| | | |
|---|---|---|
| TW | I451433 B | 9/2014 |
| WO | 2015119973 A1 | 8/2015 |

*Primary Examiner* — Tha-O H Bui
(74) *Attorney, Agent, or Firm* — Franklin M. Schellenberg; Haynes Beffel & Wolfeld LLP

(57) ABSTRACT

An integrated circuit includes a memory and peripheral circuits with a temperature sensor used to automatically adjust operating voltages. The temperature sensor includes a first circuit to generate a temperature-dependent voltage (TDV) that is dependent on an operating temperature of the integrated circuit, and a second circuit to generate a plurality of temperature reference voltages, based on or more codes. One or more comparator circuits compare individual ones of the plurality of reference voltages with the TDV, to generate one or more comparison signals that are indicative of the operating temperature of the integrated circuit.

17 Claims, 14 Drawing Sheets

(56) References Cited

U.S. PATENT DOCUMENTS

2010/0271246 A1 10/2010 Chern et al.
2013/0136149 A1 5/2013 Soenen et al.

\* cited by examiner

PIECEWISE LINEAR AND TRIMMABLE TEMPERATURE SENSOR

PRIORITY APPLICATION

This application is a continuation of U.S. patent application Ser. No. 17/205,836 filed 18 Mar. 2021 (now U.S. Pat. No. 11,676,669); which application is incorporated herein by reference.

BACKGROUND

Field

The present invention relates to temperature sensors usable within integrated circuits.

Description of Related Art

In many integrated circuits, including memory devices, various circuit components (such as memory array cells in the circuit) behave in a manner that is affected by chip temperature. It is desirable to provide circuitry suitable for implementation on integrated circuits to provide temperature information, and use this information to adjust operating parameters (such as operating voltages for the memory array) of the circuits on the integrated circuit.

SUMMARY

To reduce the disadvantage of temperature effects on the memory operation, a temperature sensing component is provided on an integrated circuit memory system. The temperature sensing components are also suitable for other uses.

An integrated circuit is described which includes a first circuit to generate a temperature-dependent voltage (TDV) that varies in response to a variation in an operating temperature of the integrated circuit. A memory of the integrated circuit stores one or more codes. The integrated circuit further includes a second circuit to generate a plurality of temperature reference voltages, based on the one or more codes. In an example, the temperature reference voltages vary in response to the variation in the operating temperature of the integrated circuit. The variation of the TDV in response to the variation in operating temperature is different from the variation of the plurality of temperature reference voltages in response to the variation in the operating temperature. In an example, the TDV has a positive temperature coefficient within an operating temperature range of the IC, and the plurality of temperature reference voltages are temperature independent within the operating temperature range of the IC. The integrated circuit further includes one or more comparator circuits to compare individual ones of the plurality of temperature reference voltages with the TDV, to generate one or more output signals that are indicative of the operating temperature of the integrated circuit.

A method for operating a temperature sensor of an integrated circuit is described, where the method includes generating a TDV that varies in response to a variation in the operating temperature of the integrated circuit. A memory of the integrated circuit stores one or more codes. A plurality of temperature reference voltages is generated, based on the one or more codes. In an example, the variation of the TDV in response to the variation in the operating temperature is different from a variation of the plurality of temperature reference voltages in response to the variation in the operating temperature. Individual ones of the plurality of temperature reference voltages are compared with the TDV, to generate one or more output signals that are indicative of the operating temperature of the integrated circuit.

Also described is an integrated circuit that includes a first voltage generator to generate a first voltage that varies with temperature. A reference voltage generator circuit of the integrated circuit generates a plurality of temperature reference voltages which are temperature independent within an operating temperature range of the integrated circuit, based on one or more codes. A comparator circuit of the integrated circuit compares the plurality of temperature reference voltages to the first voltage. The integrated circuit further includes logic that, responsive to the comparator circuit, generates a digital signal indicating temperature.

Other aspects and advantages of the present invention can be seen on review of the drawings, the detailed description and the claims, which follow.

DETAILED DESCRIPTION

A detailed description of embodiments of the present invention is provided with reference to the FIGS. 1-14.

Figure 1:
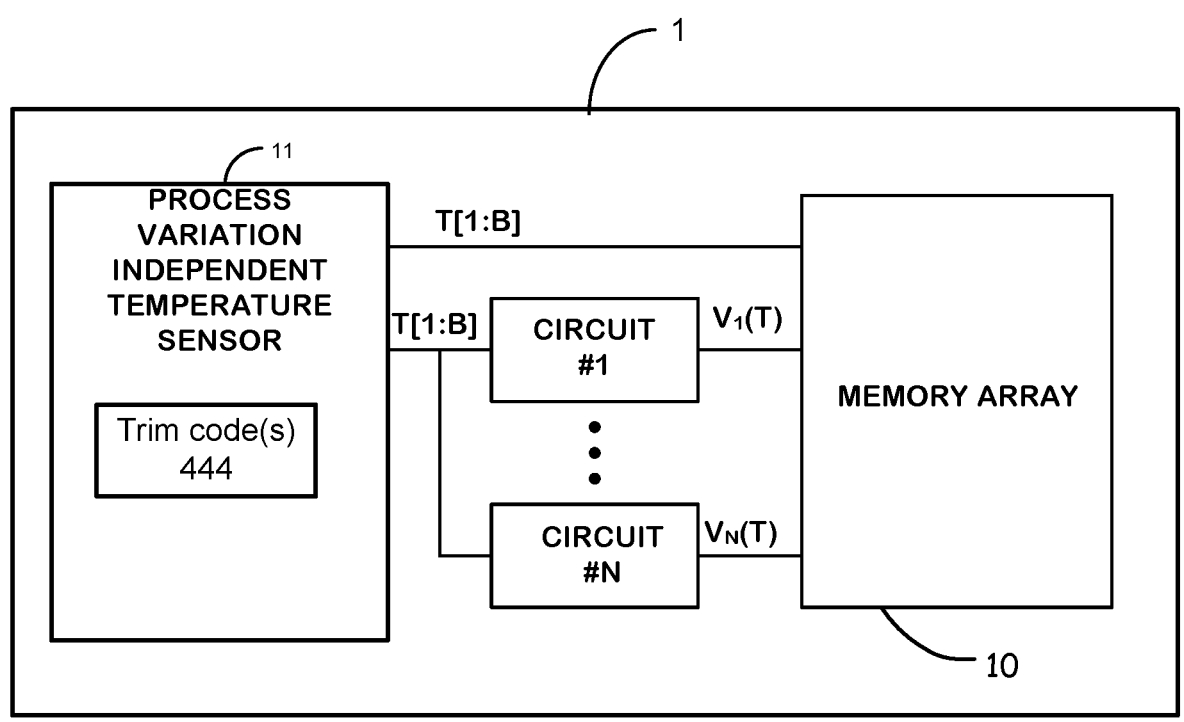
FIG. 1 is a simplified block diagram of an integrated circuit including a temperature sensor as described herein.

FIG. 1 is a block diagram of an Integrated Circuit (IC) 1, such as an integrated circuit memory device, that includes a process invariant temperature sensor 11. The IC 1 includes the temperature sensor 11, a memory array 10, and peripheral circuits, including circuit #1, . . . circuit #N. The temperature sensor 11 is a process invariant temperature sensor. For example, the temperature sensor 11 is calibrated such that variations in the manufacturing process of the IC 1 do not affect the operations of the temperature sensor 11. In an embodiment, the temperature sensor 11 includes, or is coupled to, a memory that stores one or more trim codes 444. The trim codes 444 are used to calibrate the temperature sensor 11, such that variations in the manufacturing process of the IC 1 do not affect the operations of the temperature sensor 11, as will be discussed in further detail herein in turn.

The peripheral circuits generate voltages $V_1(T)$ to $V_N(T)$ that are controlled to vary as a function of temperature, in response to the output of the temperature sensor 11. The output of the temperature sensor 11 is a digital signal T[1:B] indicative of an operating temperature of the IC 1, which can be used by the peripheral circuits to control the magnitude of the voltages being generated. Also, in some embodiments, the temperature sensor 11 can apply the signal indicative of the temperature T directly to the memory array 10. The memory array 10 can, in some embodiments, be a nonvolatile memory. In some embodiments, the memory array 10 is a flash memory.

Although FIG. 1 illustrates one example application of the temperature sensor 11 in the IC 1 comprising the memory array 10, the temperature sensor 11 can be used in any other type of IC that can be used for any other application. Merely as an example, the temperature sensor 11 can be used in an IC comprising a processor, and the temperature T indicated in the output of the temperature sensor 11 can be used to control one or more operating parameters of the processor, such as an operating frequency and/or an operating voltage of the processor. Thus, FIG. 1 is not intended to limit the use of the temperature sensor 11 for a specific application within an integrated circuit memory device, and is used merely as an example.

Figure 2:
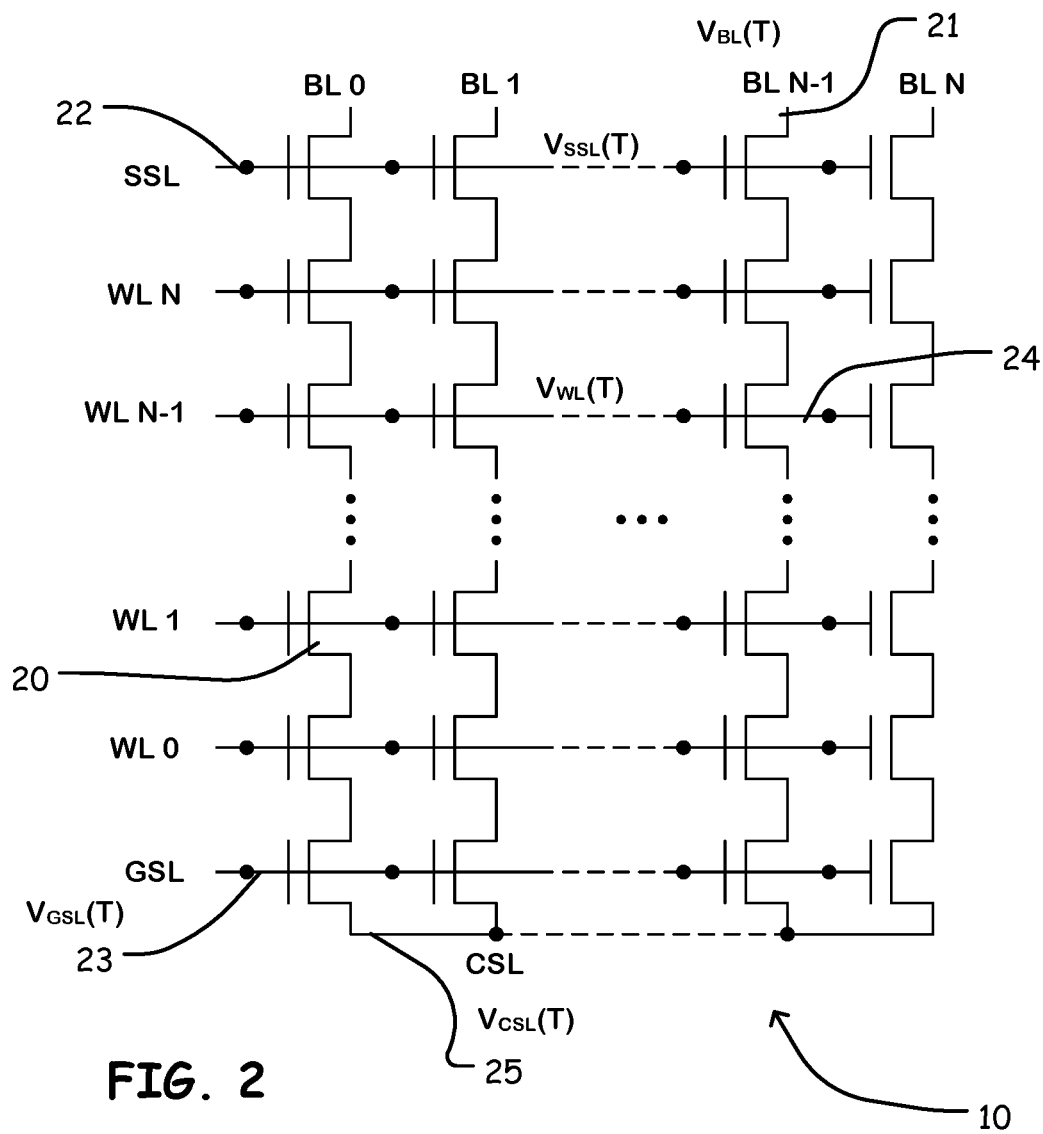
FIG. 2 is a simplified diagram of a NAND flash memory array suitable for use in the circuit of FIG. 1.

FIG. 2 is a schematic diagram of a NAND flash memory array which can be used as the array 10 in the IC 1 of FIG. 1. The NAND flash memory array includes a plurality of bit lines BL 0 to BL N, a plurality of word lines WL 0 to WL N, an upper string select line SSL and a lower string select line GSL. Memory cells (e.g. 20) are arranged in series along the bit lines to a common source line CSL, and have gates along respective word lines.

Peripheral circuits for array like that of FIG. 2 generate voltages as a function of the signal indicating temperature provided by the temperature sensor 11. For example, a voltage $V_{SSL}(T)$ can be applied to the SSL line 22 that is varied by the peripheral circuits as a function of temperature. A voltage $V_{BL}(T)$ can be applied to the bit line BL N-1 21 that is varied by the peripheral circuits as a function of temperature. A voltage $V_{WL}(T)$ can be applied to the word line WL N-1 24 that is varied by the peripheral circuits as a function of temperature. A voltage $V_{GSL}(T)$ can be applied to the GSL line 23 that is varied by the peripheral circuits as a function of temperature. A voltage $V_{CSL}(T)$ can be applied to the CSL line 25 that is varied by the peripheral circuits as a function of temperature. The various operating voltages for the memory array 10 can be adjusted individually or in combination to establish optimized read windows or other performance measures such as program and erase speeds or efficiencies.

Figure 3:
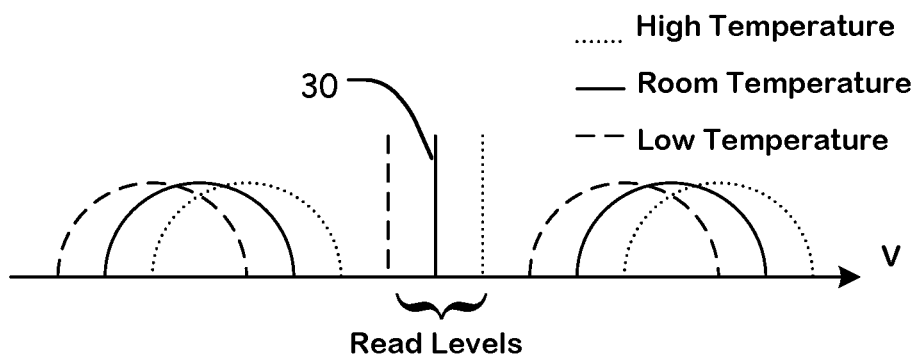
FIG. 3 illustrates operating voltages which can change the temperature in a memory array such as the memory of FIG. 2.

In operation, a NAND flash memory array like that of FIG. 2 can have operating characteristics that are a function of temperature. One example is illustrated in FIG. 3. FIG. 3 is a graph of the distribution of threshold voltages for memory cells in an erased state on the left side, and in a programmed state on the right side. As illustrated, in the erased state at high temperature, the threshold voltage distribution is shifted higher. At room temperature, the threshold voltage distribution for the erased state is at an intermediate level. At low temperature, the threshold voltage distribution is shifted lower. Likewise, in the programmed state at high temperature, the threshold voltage distribution is shifted higher. At room temperature, the threshold voltage distribution for the programmed state is at an intermediate level. At low temperature, the threshold voltage distribution is shifted lower.

Peripheral circuits as described herein are designed to automatically adjust a word line voltage read level 30 according to temperature so as to maintain read margin across the range of temperature for which the device is specified to operate. In a similar manner, the peripheral circuits can be configured to adjust other voltages in the array in order to maintain effective operation across the specified temperature range for a variety of memory operations, including program, erase, and read operations.

Figure 4:
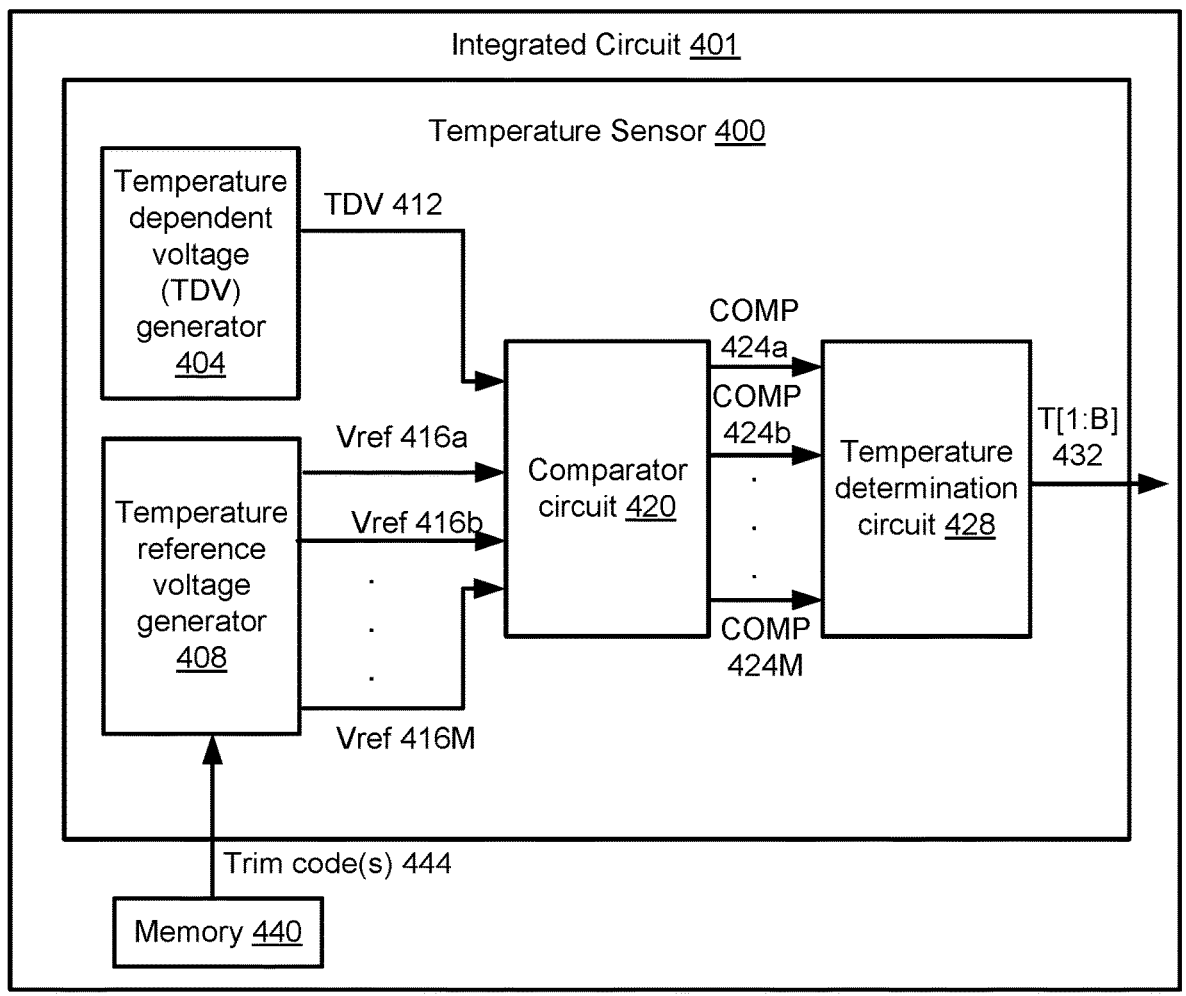
FIG. 4 is a simplified diagram of a temperature sensor according to embodiments of the present technology.

FIG. 4 is a simplified diagram of a temperature sensor 400 for implementation on an IC 401. The temperature sensor 400 can be used as the temperature sensor 11 of FIG. 1, and the IC 401 can correspond to the IC 1 of FIG. 1, in some examples.

Figure 5:
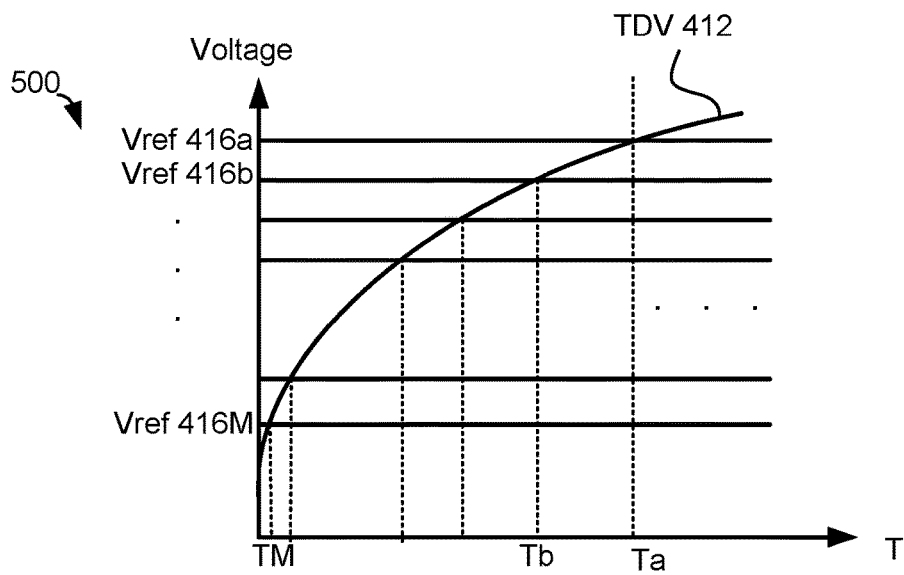
FIG. 5 is a graph showing example correlation between a Temperature Dependent Voltage (TDV) generated within the temperature sensor of FIG. 4 and temperature.

In an embodiment, the temperature sensor 400 comprises a Temperature Dependent Voltage (TDV) generator 404 to generate a TDV 412. The TDV 412 has a non-zero (e.g., positive) temperature coefficient, and TDV 412 varies with temperature. FIG. 5 is a graph 500 showing example correlation between the TDV 412 of FIG. 4 and temperature. As illustrated in FIG. 5, the TDV 412 increases with temperature. The variation of the TDV 412 with temperature is used for measuring an operating temperature of the IC 401 in which the temperature sensor 400 is embedded.

It may be noted that the temperature being measure by the temperature sensor 400 is a temperature at or near the TDV generator 408. Thus, in an embodiment, the TDV generator 404 is placed on an area of the IC 401, for which the temperature measurement is desired. For example, different sections of the IC 401 can have different operating temperatures. If it is desired that the temperature of a memory array within the IC 401 is to be measured, then in an example, the TDV generator 404 is placed near the memory array.

In an embodiment, the temperature sensor 400 further comprises a temperature reference voltage generator 408 to generate a plurality of temperature reference voltages Vref 416a, 416b, . . . , 416M. Thus, M number of temperature reference voltages Vref 416 are generated, where M is an appropriate positive integer. The temperature reference voltages are also referred to herein simply as reference voltages. In an embodiment, individual reference voltages Vref 416 are temperature independent, e.g., the voltage value of a Vref does not vary with temperature within an operating range of the IC 401. The temperature reference voltages are temperature independent, as the phrase is used herein, is to the degree that a bandgap voltage VBG (discussed herein in turn) having a zero or near-zero temperature coefficient is temperature independent, within the operating range of the IC 401. The graph 500 of FIG. 5 also shows examples of the Vrefs 416, e.g., illustrates Vref 416a, 416b, . . . , 416M. As illustrated, the Vrefs 416 do not vary with temperature.

More generally, the temperature dependent voltage TDV can vary as a first function of temperature, and the individual reference voltages Vrefs 416 can have values that vary as a different function, or different functions, of temperature, an example of such a different function is a temperature independent function. The difference in these functions of temperature can provide voltages, where differences between them provide indications of the temperature of the IC 401.

In an embodiment, the temperature sensor 400 further comprises a comparator circuit 420 comprising one or more comparators. The comparator circuit 420 is to compare the TDV 412 with individual ones of the plurality of Vrefs 416, and generate a corresponding comparison result COMP 424. For example, the comparator circuit 420 is to compare the TDV 412 with the Vref 416a to generate a corresponding comparison result COMP 424a, compare the TDV 412 with the Vref 416b to generate a corresponding comparison result COMP 424b, compare the TDV 412 with the Vref 416M to generate a corresponding comparison result COMP 424M, and so on. Thus, M comparison results COMP 424a, . . . , 424M are generated. A temperature determination circuit 428 receives COMP 424, and generates a temperature signal T 432 having B number of bits 1:B.

As illustrated in FIG. 5, the TDV 412 varies with temperature by a greater amount over the operating range than do the Vrefs in the plurality of Vrefs 416. As discussed above, the TDV 412 is compared with individual ones of the plurality of Vrefs 416, to select a Vref 416 that is closest to the TDV 412. Note that in the graph 500, an intersection point of TDV 412 with a specific Vref 416 is associated with a corresponding temperature value. For example, an intersection point of TDV 412 with Vref 416a is associated with a temperature value Ta, an intersection point of TDV 412 with Vref 416b is associated with a temperature value Tb. Thus, if the temperature of the TDV generator 404 is Ta, then the TDV 412 is generated to have a value equal to that the Vref 416a. Similarly, if the temperature of the TDV generator 404 is Tb, then the TDV 412 is generated to have a value equal to that the Vref 416b, and so on. During the comparison operation performed by the comparator circuit 420, if the TDV 412 is determined to be equal to, or sufficient close, for example, to the Vref 416a, then the temperature sensed by the temperature sensor 400 is determined to be Ta. Similarly, if the TDV 412 is determined to be equal to, or sufficient close to the Vref 416b, then the temperature sensed by the temperature sensor 400 is determined to be Tb, and so on.

Figure 6:
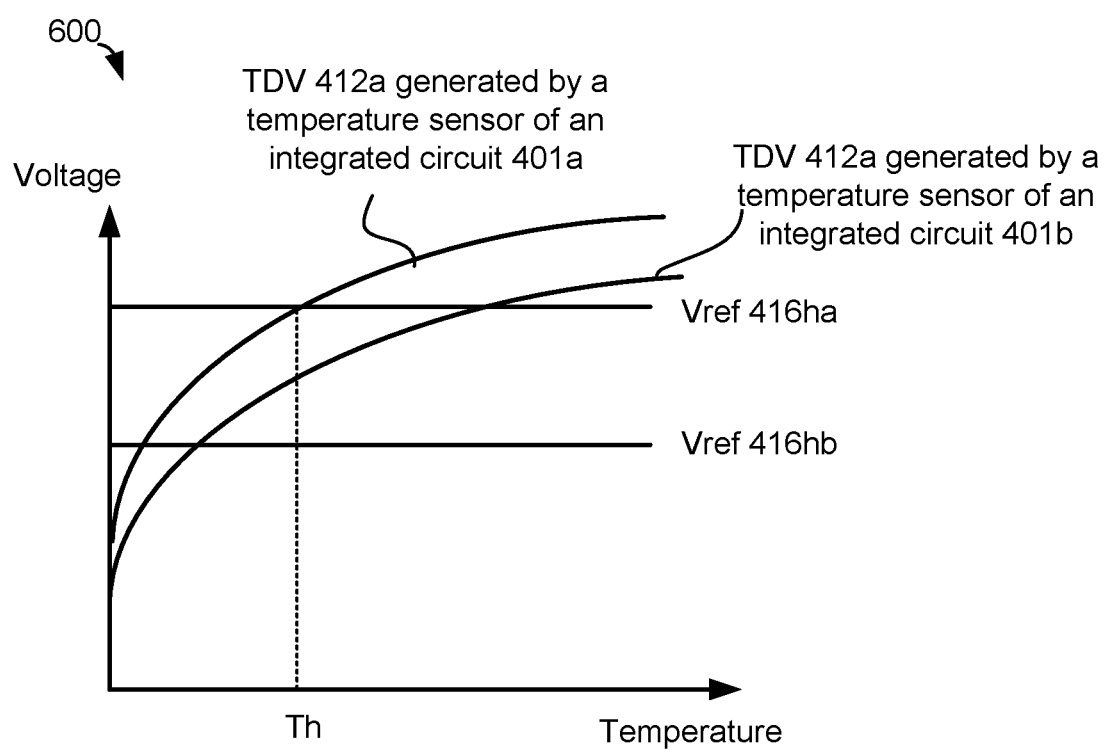
FIG. 6 is a graph showing example variations of TDVs of two different ICs with temperature.

FIG. 6 is a graph 600 showing example variations of TDVs of two different ICs 401a and 401b with temperature. For example, assume both the ICs 401a and 401b include similar instances of the temperature sensor 400, and the ICs 401a and 401b output corresponding TDVs 412a and 412b, respectively. FIG. 6 illustrates example variations of the TDVs 412a, 412b with temperature. Assume that the ICs 401a and 401b have similar design and similar components (e.g., these are two instances of the IC 401 of FIG. 4), and are manufactured by the same manufacturer. Because the ICs 401a, 401b have similar design and similar components, the variation of TDV 412a with temperature and the variation of TDV 412b with temperature should ideally be the same, i.e., the graphs for TDVs 412a and 412b should overlap in FIG. 6. However, in practice, the temperature dependencies of TDVs 412a and 412b can be slightly different. Such difference can be due to process variations during manufacturing of the ICs 401a and 401b. Thus, to detect an example temperature "Th" (see FIG. 6), a temperature reference voltage Vref 416ha is to be used in the IC 470a, whereas a temperature reference voltage Vref 416hb is to be used in the IC 470b, where Vref 416ha and Vref 416hb have different voltage levels, as illustrated in FIG. 6. Thus, each of the ICs 470a, 470b has to be uniquely or individually calibrated, for the corresponding temperature sensor to work accurately.

In an embodiment, referring again to FIG. 4, the temperature sensor 400 compensates for process variations that may occur during the manufacturing process. For example, the temperature sensor 400 receives one or more trim codes 444, which are calibrated during a manufacturing and/or calibration process of the IC 401. The trim codes 444 are stored in a memory 440.

In the example illustrated in FIG. 4, the memory 440 is an "on-chip" memory, i.e., included within the IC 401. However, in another example, the memory 440 is an "off-chip" memory, i.e., located outside the IC 401. In an example, the memory 440 comprises one or more parameter registers, such as non-volatile parameter registers. In an example, the memory 440 comprises one or more Write-Once Read-Many (WORM) memory, e.g., one or more WORM registers (e.g., in which information, once written, cannot be modified, but can be read multiple times). In an example, the memory 440 comprises one or more programmable fuses, in which the trim codes 444 are programmed. In an example, the memory 440 comprises one or more flash memory cells, and/or another type of non-volatile memory in which the trim codes 444 can be written, and are accessible by the reference voltage generator 408. For example, during a calibration phase of the temperature sensor 400, a testing platform writes or programs the trim codes 444 in the memory 440 (e.g., via a register write command), and the reference voltage generator 408 accesses the trim codes 444 from the memory 440 during an operational phase of the temperature sensor 400. The previously calibrated trim codes 444 are used by the reference voltage generator 408 to generate the Vrefs 416 at appropriate levels, for proper detection of temperature by the temperature sensor 400, as will be discussed herein in further detail in turn.

Figure 7:
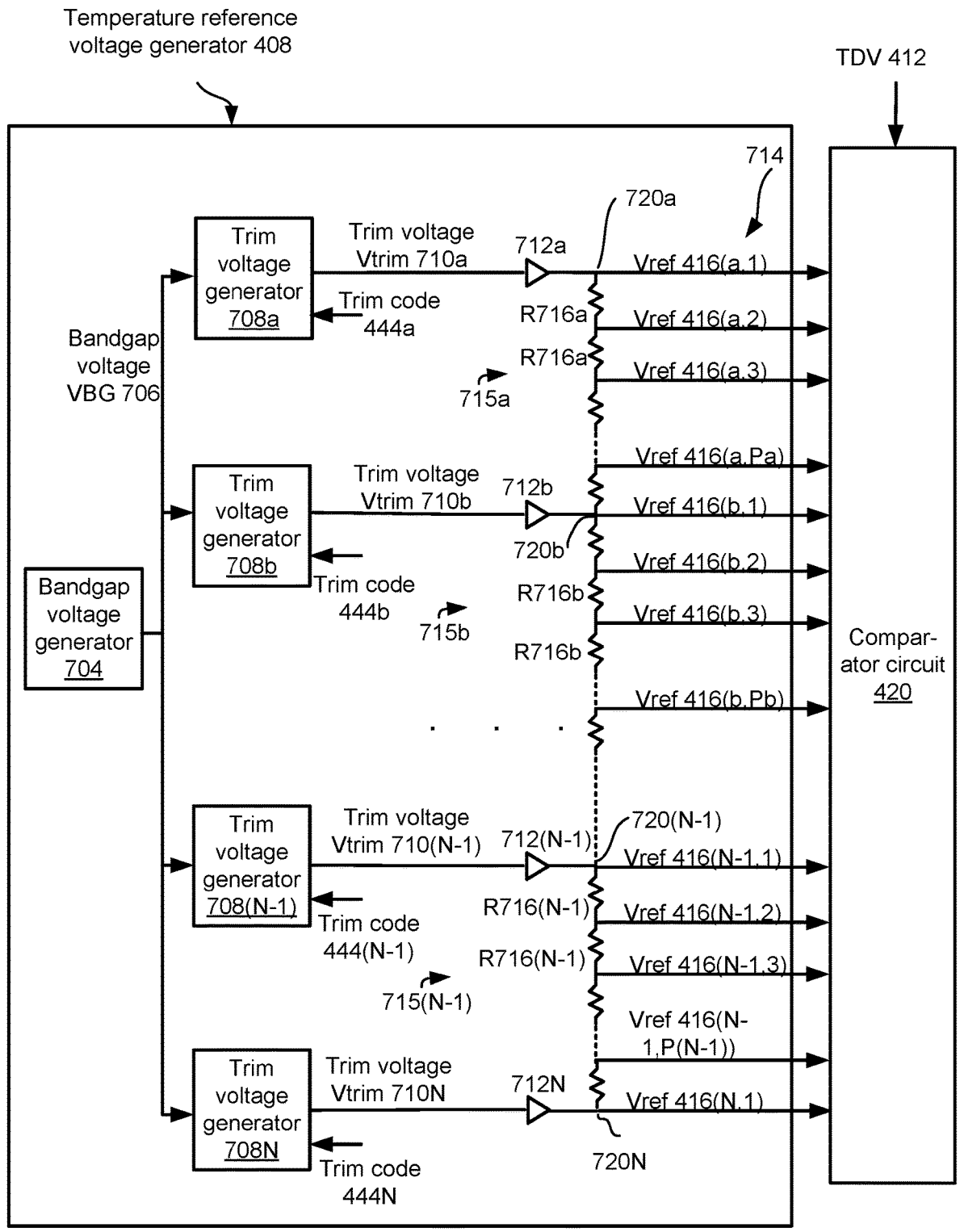
FIG. 7 is a circuit diagram of a temperature reference voltage generator generating a plurality of temperature reference voltages.

FIG. 7 is a circuit diagram of a temperature reference voltage generator (such as the temperature reference voltage generator 408 of the temperature sensor 400 of FIG. 4), which can be formed on an integrated circuit (such as the IC 401 of FIG. 4), to generate a plurality of temperature reference voltages Vref 416(a,1), 416(N,1). Referring to FIGS. 4 and 7, the reference voltage generator 408 comprises a bandgap voltage generator 704 that generates a bandgap voltage VBG 706. Although the bandgap voltage generator 704 is illustrated to be included in the reference voltage generator 408, in another embodiment, the bandgap voltage generator 704 is external to the reference voltage generator 408, can be external to the temperature sensor 400, and/or can even be external to the IC 401. The bandgap voltage VBG 706 is a fixed or constant voltage that is invariant to, or does not change with, power supply variations, temperature changes, and/or circuit loading.

The reference voltage generator 408 further comprises a plurality of trim voltage generators 708a, 708b, . . . , 708N, where N is a positive integer. Each trim voltage generator 708 receives the bandgap voltage VBG 706 and a corresponding trim code 444, and generates a corresponding trim voltage Vtrim 710. For example, the trim voltage generator 708a receives the bandgap voltage VBG 706 and a corresponding trim code 444a, and generates a corresponding trim voltage Vtrim 710a; the trim voltage generator 708b receives the bandgap voltage VBG 706 and a corresponding trim code 444b, and generates a corresponding trim voltage Vtrim 710b, and so on. Thus, a plurality of trim voltages Vtrim 710a, 710b, . . . , 710N are generated, by the corresponding plurality of trim voltage generators 708a, 708, . . . , 708N, respectively. Generation of the trim voltages Vtrim will be discussed in further detail herein in turn.

The reference voltage generator 408 further comprises a voltage divider 714, which is a resistor ladder. The voltage divider 714 receives, at a node 720a of the voltage divider 714, the trim voltage 710a through a corresponding buffer 712a; the voltage divider 714 receives, at a node 720b of the voltage divider 714, the trim voltage 710b through a corresponding buffer 712b; the voltage divider 714 receives, at a node 720N of the voltage divider 714, the trim voltage 710N through a corresponding buffer 712N, and so on. As will be discussed herein, in an embodiment, individual ones of the buffers 712a, . . . , 712N are unity gain buffers.

Each of the nodes 720 output a corresponding temperature invariant reference voltage Vref 416. For example, the node 720a outputs a corresponding temperature invariant reference voltage Vref 416(a,1), the node 720b outputs a corresponding temperature invariant reference voltage Vref 416(b,1), the node 720N outputs a corresponding temperature invariant reference voltage Vref 416(N,1), and so on, as illustrated in FIG. 7. Thus, the node 720a receives Vtrim 710a and outputs Vref 416(a,1), and hence, Vref 416(a,1) and Vtrim 710a are equal. Similarly, Vtrim 710b and Vref 416(b,1) are equal, Vtrim 710N and Vref 416(N,1) are equal, and so on.

The voltage divider 714 is a combination of (N−1) number of smaller voltage dividers 715a, 715b, . . . , 715(N−1), which are coupled in series. Two consecutive nodes 712y and 712(y+1) (where y is an integer that ranges from a, . . . , N−1) of the voltage divider 714 form end nodes of the corresponding smaller voltage divider 715y. For example, a smaller voltage divider 715a is formed between nodes 720a and 720b, a smaller voltage divider 715b is formed between nodes 720b and 720c, a smaller voltage divider 715(N−1) is formed between nodes 720(N−1) and 720N, and so on.

Each individual voltage divider 715 includes a corresponding plurality of resistors R716 coupled between the two corresponding end nodes. Thus, a plurality of resistors R716a of the voltage divider 715a is coupled between the nodes 720a and 720b, a plurality of resistors R716b of the voltage divider 715b is coupled between the nodes 720b and 720c, a plurality of resistors R716(N−1) of the voltage divider 715(N−1) is coupled between the nodes 720(N−1) and 720N, and so on.

In the voltage divider 715a, between any two consecutive resistors of the plurality of resistors R716a, a corresponding output reference voltage Vref 416(a,x) is generated, where x varies from 2 to Pa. For example, the smaller voltage divider 715a between nodes 720a and 720b outputs reference voltages Vref 416(a,2), Vref 416(a,3), . . . Vref 416(a,Pa), where Pa is an appropriate positive integer. Furthermore, Vref 416(a,2), Vref 416(a,Pa) are within a voltage range defined by Vref 416(a, 1) and Vref 416(b1) of the two end nodes 702a and 702b of the smaller voltage divider 715a, for example. Similarly, the smaller voltage divider 715(N−1) between nodes 720(N−1) and 720N outputs reference voltages Vref 416(N−1,2), Vref 416(N−1,3), Vref 416(N−1,P(N−1)), where P(N−1) is an appropriate positive integer. Thus, the voltage divider 714 outputs a plurality of reference voltages Vref 416(a,1), Vref 416(a,Pa), Vref 416(b,1), Vref 416(b,Pb), Vref 416(N−1,1), Vref 416(N−1,P(N−1)), Vref 416(N,1).

Figure 8A:
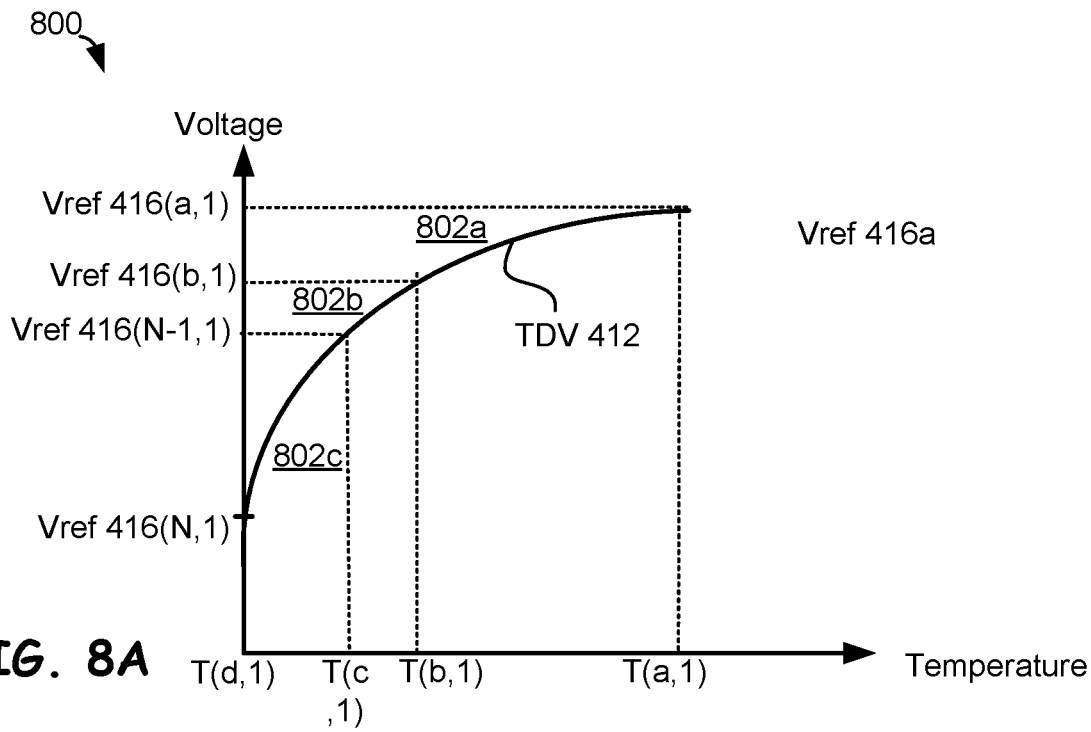
FIG. 8A is a graph showing example non-linear variation of TDV of FIG. 4 with temperature.

FIG. 8A is a graph 800 showing example non-linear variation of the TDV 412 of FIG. 4 with temperature. The graph of FIG. 8A is illustrated to explain the operations of the temperature reference voltage generator 408 of FIG. 7. Referring to FIGS. 7 and 8, the graph 800 illustrates a non-linear relationship between the TDV 412 and the temperature. A piecewise linearity is of the TDV 412 is approximated or assumed, by dividing the TDV 412 graph in different sections. For example, the TDV graph 800 divided in three sections 802a, 802b, 802c, where in each section of the graph 800, the TDV 412 is approximated or assumed to be linear (although the TDV 412 may not be strictly liner within each section).

Thus, the TDV 412 is approximated to be linear between temperatures T(a,1) and T(b,1), the TDV 412 is approximated to be linear between temperatures T(b,1) and T(c,1), and the TDV 412 is approximated to be linear between temperatures T(c,1) and T(d,1). An increase in a number of sections in which the TDV graph is divided increases an accuracy of the piecewise-linear approximation, thereby yielding relatively better temperature sensing, but it comes with an increased cost (e.g., increased number of trim voltage generators). On the other hand, a decrease in the number of sections in which the TDV graph is divided decreases the accuracy of the piecewise-linear approximation, thereby yielding relatively worse temperature sensing, but also save cost (e.g., increased number of trim voltage generators). Thus, the number of sections in which the TDV graph is divided may be based on a desired accuracy in temperature reading and/or cost consideration, and can be implementation specific.

Thus, the graph 800 represents a special case of the reference voltage generator 408 of FIG. 7, in which N (e.g., the number of trim voltage generators) is equal to four. Thus, when the TDV 412 is sectioned in three different sections (e.g., 802a, 802b, 802c) for approximating piece-wise linearity, the number of stages N in the reference voltage generator 408 is 4. Assume, as illustrated in FIG. 8A, that TDV 412 is equal to Vref 416(a,1), Vref 416(b,1), Vref 416(c,1), and Vref 416(d,1), respectively, for temperatures T(a,1), T(b,1), T(c,1), and T(d,1). Thus, in such a scenario, the trim codes 444 are calibrated such that the trim voltage generator 708a outputs the temperature invariant reference voltage Vref 416(a,1), the trim voltage generator 708b outputs the temperature invariant reference voltage Vref 416(b,1), the trim voltage generator 708c outputs the temperature invariant reference voltage Vref 416(c,1), and the trim voltage generator 708d outputs the temperature invariant reference voltage Vref 416(d,1).

As will be discussed herein in further detail in turn, the comparator circuit 420 receives the reference voltages Vrefs, and compares the reference voltages with the TDV 412. In case the TDV 412 is within a threshold range of a specific reference voltage Vref 416(a,1), the temperature sensor 400 determines the sensed temperature to be T(a,1), because as illustrated in FIG. 8A, the TDV 412 is at Vref 416(a,1) at this temperature. Similarly, in case the TDV 412 is within a threshold range of a specific reference voltage Vref 416(b,1), the temperature sensor 400 determines the sensed temperature to be T(b,1), because as illustrated in FIG. 8A, the TDV 412 is at Vref 416(b,1) at this temperature, and so on.

Figure 8B:
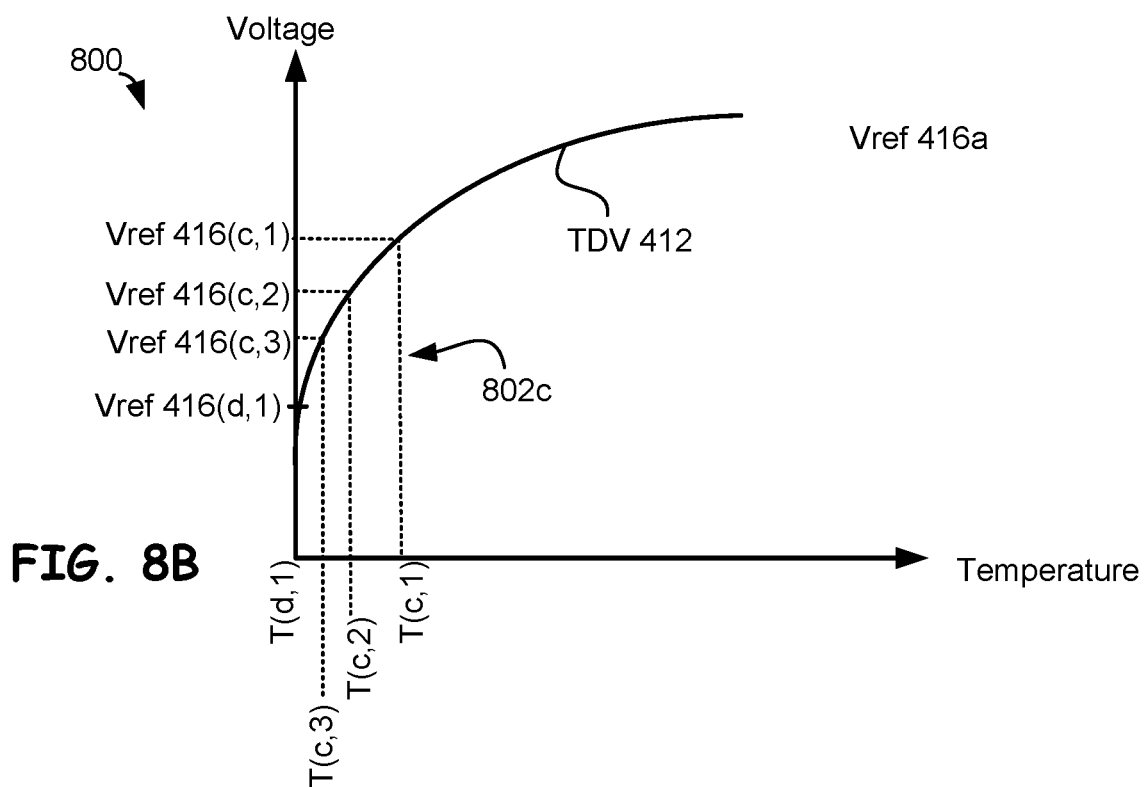
FIG. 8B illustrates the graph of FIG. 8A, with a section of the graph further subdivided in finer sections.

FIG. 8B illustrates the graph 800 of FIG. 8A, with a section of the graph further subdivided in finer sections. For example, the section 802c corresponding to the voltage range between Vref 416(c,1) and Vref 416(d, 1) is further subdivided using smaller voltage increments, such as Vref 416(c,2) and Vref 416(c,3). Thus, the section 802c is subdivided in three corresponding subsections, defined by the four voltage levels illustrated in FIG. 8B.

Furthermore, reference voltage Vref 416(c,2) corresponds to a temperature T(c,2), and reference voltage Vref 416(c,3,) corresponds to a temperature T(c,3), as illustrated in FIG. 8B. However, because the temperature dependency of TDV 412 is approximated to be linear in the voltage range defined by the reference voltages Vref 416(c,1) and Vref 416(c,1), the temperature sensor 400 need not be calibrated for individual ones of the reference voltages Vref 416(c,2) and Vref 416(c,3) using any trim code. Rather, reference voltages Vref 416(c,1) and Vref 416(d,1) are calibrated using corresponding trim codes 444c and 444d, respectively. Once these reference voltages are calibrated, because of the linearity property of the TDV 412 assumed between these reference voltages, the reference voltages Vref 416(c,2) and Vref 416(c,3) are automatically or inherently calibrated.

Thus, referring again to FIG. 7, only reference voltages Vref 416 a,1), Vref 416(b,1), Vref 416(N,1) are calibrated using corresponding trim codes 444a, 444b, . . . 444N, respectively. Furthermore, as discussed with respect to FIGS. 8A and 8B, TDV 412 is approximated to be linear in the voltage range defined by reference voltages Vref 416(a, 1) and Vref 416 (b,1); TDV 412 is approximated to be linear in the voltage range defined by reference voltages Vref 416(b,1) and Vref 416 (c,1); TDV 412 is approximated to be linear in the voltage range defined by reference voltages Vref 416 (N–1,1) and Vref 416(N,1); and so on. Accordingly, other intermediate reference voltages (such as reference voltages Vref 416(a,2), Vref 416(a,3), Vref 416(b,2), Vref 416(b,3), and so on) need not be individually calibrated using corresponding trim codes.

In an embodiment, the comparator circuit 420 compares individual ones of the reference voltages Vref generated by the temperature reference voltage generator 408 with the TDV 412. Based on a specific reference voltage being determined to be sufficiently close to the TDV 412, the temperature sensor 400 determines the operating temperature to be the temperature corresponding to the specific reference voltage. For example, if the comparator circuit 420 determines that Vref 416(c,2) is sufficiently close to the TDV 412, the temperature sensor 400 determines the operating temperature to be the corresponding temperature T(c,2).

Figure 9:
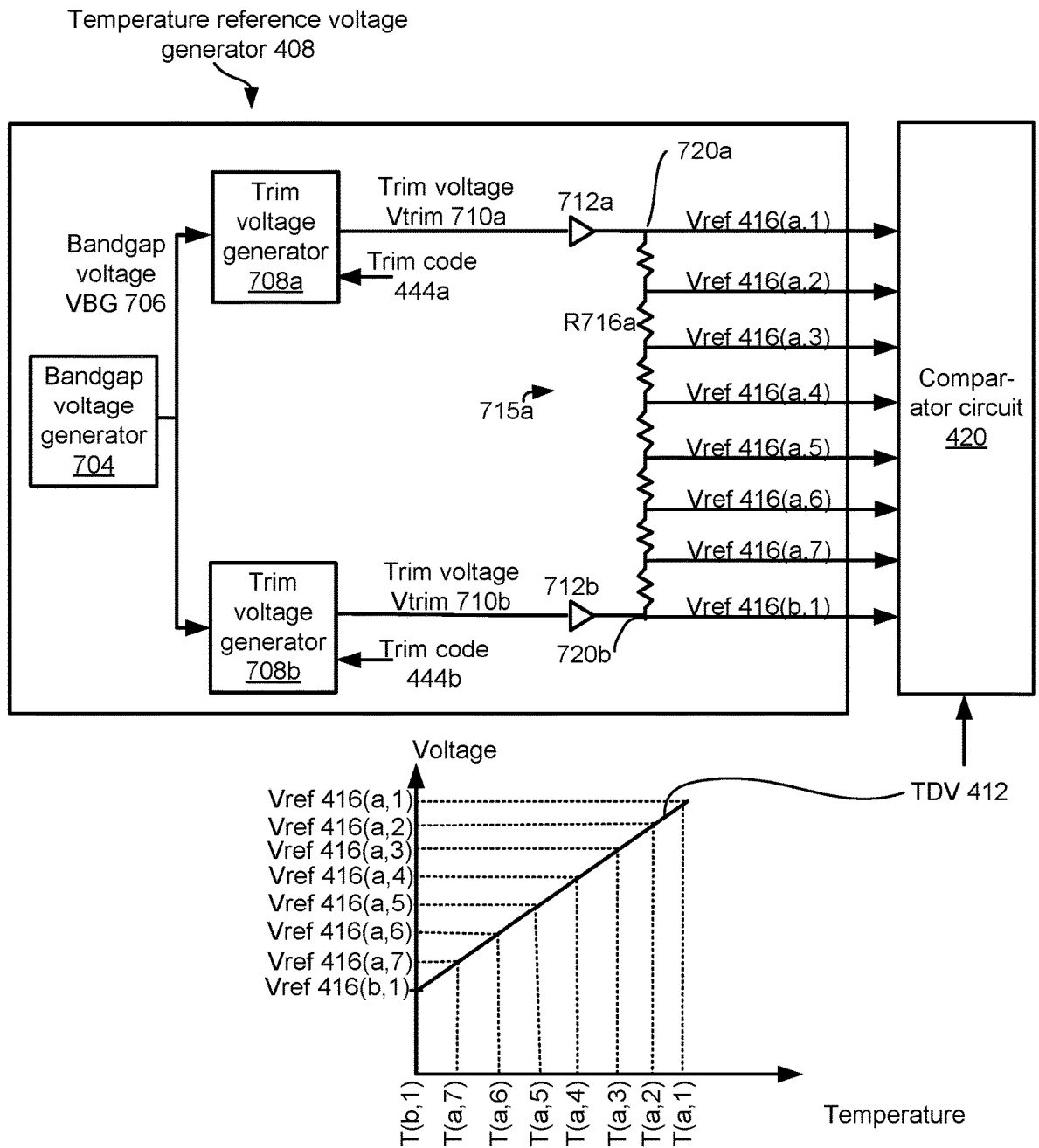
FIG. 9 is a circuit diagram of a temperature reference voltage generator generating a plurality of temperature reference voltages, where linearity of TDV is assumed for the circuit of FIG. 9.

FIG. 9 is a circuit diagram of a temperature reference voltage generator (such as the temperature reference voltage generator 408 of the temperature sensor 400 of FIG. 4), which can be formed on an integrated circuit (such as the IC 401 of FIG. 4), to generate a plurality of temperature reference voltages, where linearity of the TDV 412 is assumed for the circuit of FIG. 9. For example, FIG. 9 also illustrates a graph depicting a thermal behavior of TDV 412, and as seen, the TDV 412 varies substantially linearly (or is approximated or assumed to vary linearly) with temperature, over a range of temperatures T(a,1) and T(b,1) to be measured. Accordingly, the reference voltage generator 408 has merely two trim voltage generators 708a and 708b, to respectively generate the reference voltages Vref 416(a,1) and Vref 416(b,1). Other intermediate reference voltages Vref 416(a,2), Vref 416(a,7) are generated using the voltage divider 715a, without any specific calibration for these intermediate reference voltages. Each of the intermediate reference voltages Vref 416(a,2), Vref 416(a,7) is assigned a corresponding temperature. For example, the voltage range between reference voltages Vref 416(a,1) and Vref 416(b,1) is equally subdivided between 7 equal sections, thereby determining the intermediate reference voltages Vref 416(a, 2), Vref 416(a,7). Similarly, the temperature range between T(a,1) and T(b,1) is equally subdivided between 7 equal sections, thereby determining the intermediate temperatures T(a,2), T(a,7). Subsequently, the reference voltages Vref 416(a,2), Vref 416(a,7) are respectively assigned the corresponding temperatures T(a,2), T(a,7), as illustrated in the graph of FIG. 9. Merely as an example, if the comparator circuit 420 determines that TDV 412 is equal to the reference voltage Vref 416(a,5), the temperature sensor 400 determines the operating temperature to be T(a,5).

Although FIG. 9 illustrates dividing the voltage range between reference voltages Vref 416(a,1) and Vref 416(b,1) in seven sections (e.g., thereby generating six intermediate reference voltages Vref 416(a,2), Vref 416(a,7)), such a number of sub-divisions is merely an example, and any appropriate number of intermediate reference voltages can be generated within the voltage range between reference voltages Vref 416(a,1) and Vref 416(b,1).

Figure 10A:
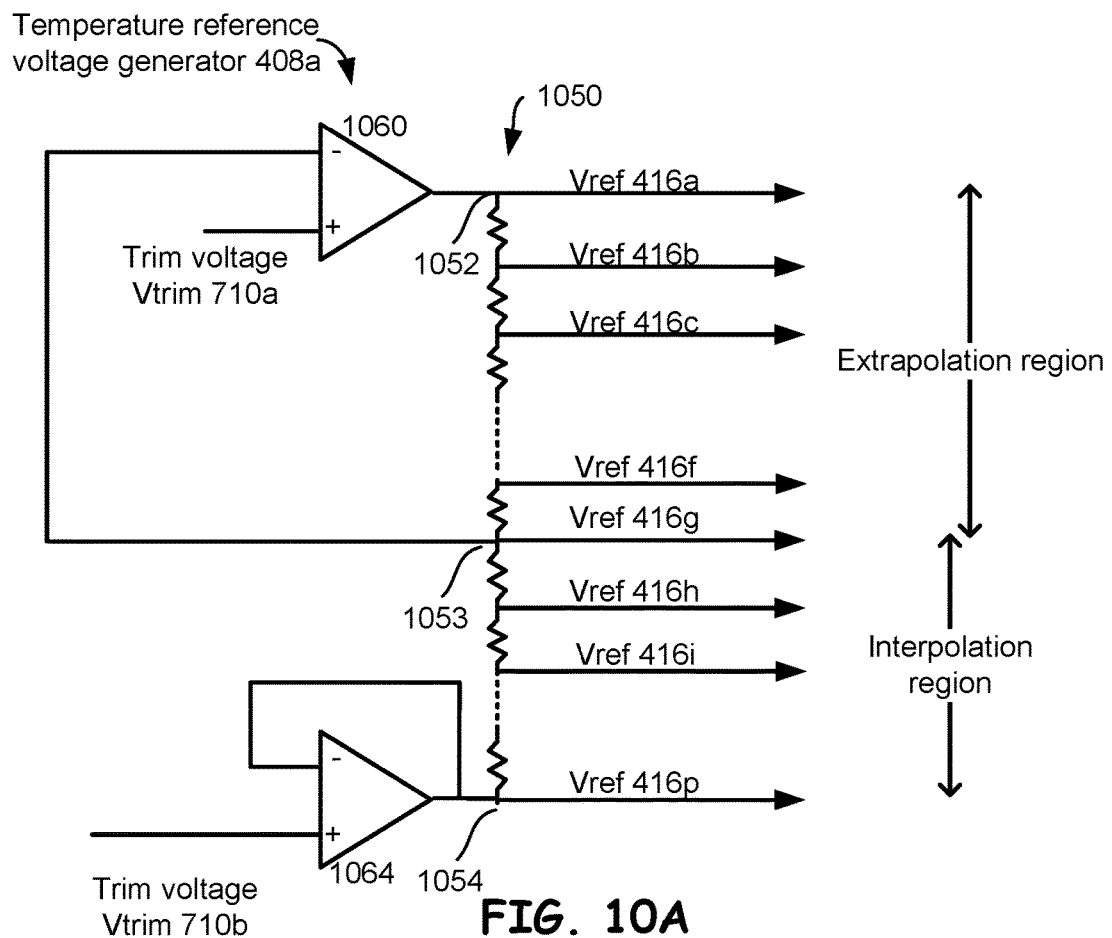
FIG. 10A is another circuit diagram of a temperature reference voltage generator generating a plurality of temperature reference voltages.
Figure 10B:
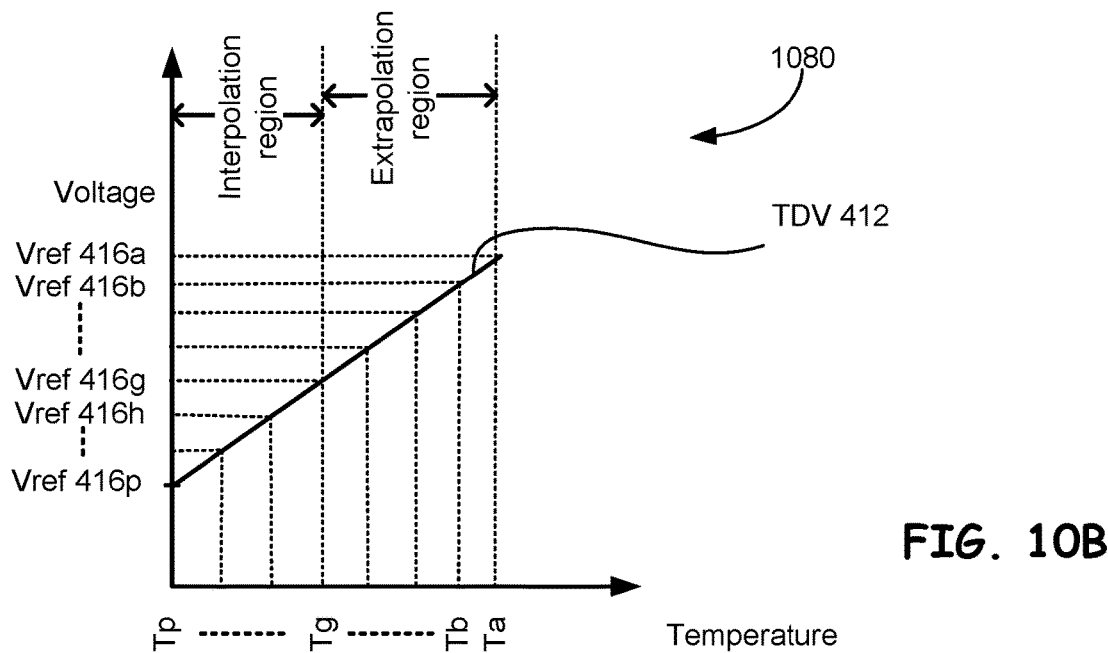
FIG. 10B is a graph illustrating a linear relationship between TDV and the temperature for the temperature reference voltage generator of FIG. 10A.

FIG. 10A is a circuit diagram of a temperature reference voltage generator 408a (which can be used as the temperature reference voltage generator of the temperature sensor 400 of FIG. 4), which can be formed on an integrated circuit (such as the IC 401 of FIG. 4), to generate a plurality of temperature reference voltages, and FIG. 10B is a graph 1080 illustrating a linear relationship between the TDV 412 and the temperature for the temperature reference voltage generator 408a of FIG. 10A.

The reference voltage generator 408a comprises an operational amplifier 1060 receiving the trim voltage Vtrim 710a at its non-inverting input, and also comprises an operational amplifier 1064 receiving the trim voltage Vtrim 710b at its non-inverting input. The operational amplifier 1064 is configured as a unity gain buffer, with an output of the operational amplifier 1064 coupled to its inverting terminal. The outputs of the operational amplifier 1060 and 1064 are coupled to two end nodes 1052 and 1054 of a voltage divider 1050, which is a resistor ladder. The voltage divider 1050 has an intermediate node 1053, which is also coupled to the inverting terminal of the operational amplifier 1060.

The node 1052 generates a reference voltage Vref 416a, the node 1053 generates a reference voltage Vref 416g, and the node 1054 generates a reference voltage Vref 416p. Intermediate nodes between the nodes 1052 and 1053 generate intermediate reference voltages V416b, V416c, and so on, as illustrated in FIG. 10A. Intermediate nodes between the nodes 1053 and 1054 generate intermediate reference voltages V416h, V416i, and so on, as illustrated in FIG. 10A. Due to the feedback from the node 1053, the Vref 416g is maintained at the trim voltage Vtrim 710a. Vref 416a, Vref 416f are higher than Vref 416g.

The graph in FIG. 10B illustrates an extrapolation region and an interpolation region. For example, assume the temperature sensor 400 is to be calibrated for a temperature range defined by temperatures Ta to Tp. However, the temperature sensor is calibrated for voltages Vref 416g and Vref 416p, corresponding to temperatures Tg and Tp, respectively. Also, the TDV 412 curve is approximated to be linear between the temperature range Ta to Tp. Accordingly, in the voltage divider 1050, the Vref 416g is calibrated to be equal to the trim voltage 710a. Voltages Vref 416a, . . . , 416f are extrapolated, based on the voltages Vref 416g and Vref 416p, to respectively detect temperatures Ta, Tf. Furthermore, intermediate reference voltages between the voltages Vref 416g and Vref 416p are interpolated, based on the voltages Vref 416g and Vref 416p.

Figure 11A:
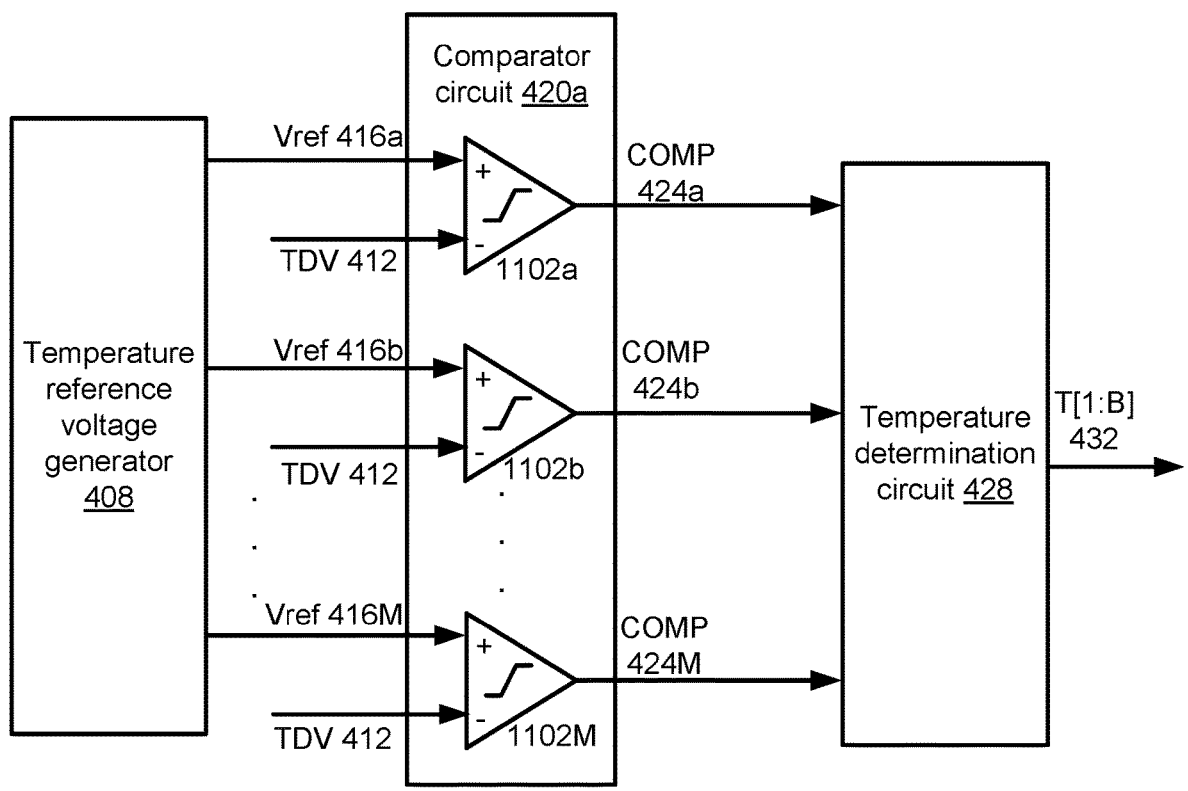
FIG. 11A illustrates an example implementation of a comparator circuit of the temperature sensor of FIG. 4, in which various comparison operations are performed in parallel.

FIG. 11A illustrates an example implementation of a comparator circuit 420a of the temperature sensor 400 of FIG. 4, in which various comparison operations are performed in parallel. The comparator circuit 420a receives reference voltages Vref 416a, Vref 416M generated by the reference voltage generator 408, example implementations of which have been discussed herein with respect to FIGS. 7, 10, and 10A.

In an embodiment, the comparator circuit 420a of FIG. 11A comprises a plurality of parallel comparators 1102a, 1102b, . . . , 1102M. Each comparator 1102 receives the TDV 412 and a corresponding reference voltage Vref 416. Individual comparator 1102 compares the TDV 412 and the corresponding reference voltage Vref 416, and outputs a corresponding comparison signal COMP 424. For example, the comparator 1102a receives the TDV 412 and the corresponding reference voltage Vref 416a, and generates COMP 424a. Similarly, the comparator 1102b receives the TDV 412 and the corresponding reference voltage Vref 416b, and generates COMP 424b, so on. In an embodiment, for the comparator 1102a, for example, if Vref 416a>TDV 412, then the comparator 1102a outputs a bit 1, and outputs a bit 0 otherwise. Other comparators operate in a similar manner.

As discussed with respect to FIGS. 4-10, Vref 416a is greater than Vref 416b, which is greater than Vref 416c, and so on. In an example use case, assume that TDV 412 is between Vref 416b and Vref 416c. Then each of COMP 424a and COMP 424b from the comparators 1102a and 1102b, respectively, is a bit 1, and each of COMP 424c, . . . , COMP 424M from the comparators 1102c, . . . , 1102M, respectively, is a bit 0. Thus, the comparator circuit 420a outputs 1100 . . . 0.

Based on the output of the comparator circuit 420a, the temperature determination circuit 428 determines that TDV 412 is between Vref 416b and Vref 416c. For example, the temperature determination circuit 428 determines the operating temperature to be Tb, Tc, or an average of Tb and Tc, based on the output 1100 . . . 0. In an embodiment, the temperature determination circuit 428 comprises a decoder or logic circuit that receives the digital output of the comparator circuit 420a, and outputs a digital signal T[1:B] which indicates the temperature. In other embodiments the signal may be analog.

Figure 11B:
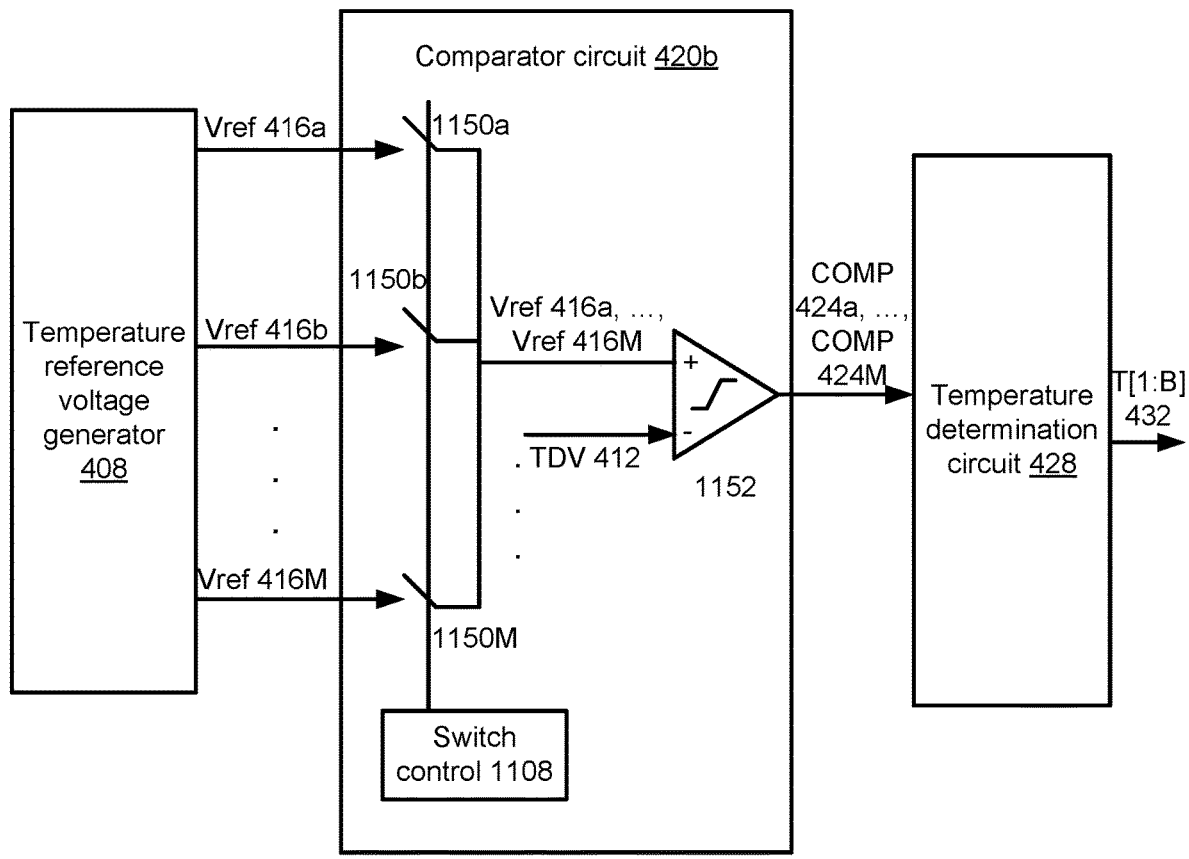
FIG. 11B illustrates an example implementation of a comparator circuit of the temperature sensor of FIG. 4, in which various comparison operations are performed in a serial manner.

FIG. 11B illustrates an example implementation of a comparator circuit 420b of the temperature sensor 400 of FIG. 4, in which various comparison operations are performed in a sequential manner. The comparator circuit 420a receives reference voltages Vref 416a, Vref 416M generated by the reference voltage generator 408, example implementations of which have been discussed herein with respect to FIGS. 7 and 10. In an embodiment, the comparator circuit 420b of FIG. 11B comprises a single comparator 1152. The comparator 1152 receives the TDV 412, and also receives the reference voltages Vref 416a, Vref 416M in a serial, time-multiplexed manner. For example, the reference voltages Vref 416a, Vref 416M are provided to the comparator 1152 via corresponding respectively switches 1150a, . . . , 1150M. The switches 1150a, . . . , 1150M are controlled by a switch controller 1108. At a given time, only one of the switches 1150a, . . . , 1150M is ON, and the remaining are OFF, and hence, the comparator 1152 receives only one of the reference voltages Vref 416a, Vref 416M at a specific time. The switches 1150a, . . . , 1150M are switched ON at a time-multiplexed manner (e.g., one after another), such that the comparator 1152 can compare individual reference voltages with the TDV 412 is a serial, time-multiplexed manner. The comparator 1152 compares the TDV 412 and the corresponding reference voltage Vref 416, and outputs a corresponding comparison signal COMP 424. For example, the comparator 1152 compares the TDV 412 and the corresponding reference voltage Vref 416a, and generates COMP 424a. Similarly, the comparator 1152 compares the TDV 412 and the corresponding reference voltage Vref 416b, and generates COMP 424b, so on. Similar to FIG. 11A, the comparator 1152 of FIG. 11B outputs a bit 1 if Vref 416a>TDV 412, and outputs a bit 0 otherwise.

As discussed with respect to FIGS. 4-10, Vref 416a is greater than Vref 416b, which is greater than Vref 416c, and so on. In an example use case, assume that TDV 412 is between Vref 416b and Vref 416c. Then each of COMP 424a and COMP 424b is a bit 1, and each of COMP 424c, . . . , COMP 424M is a bit 0. Thus, the comparator circuit 420b outputs 1100 . . . 0. Based on the output of the comparator circuit 420b, the temperature determination circuit 428 determines that TDV 412 is between Vref 416b and Vref 416c. Accordingly, the temperature determination circuit 428 determines the operating temperature to be Tb, Tc, or an average of Tb and Tc.

Figure 12:
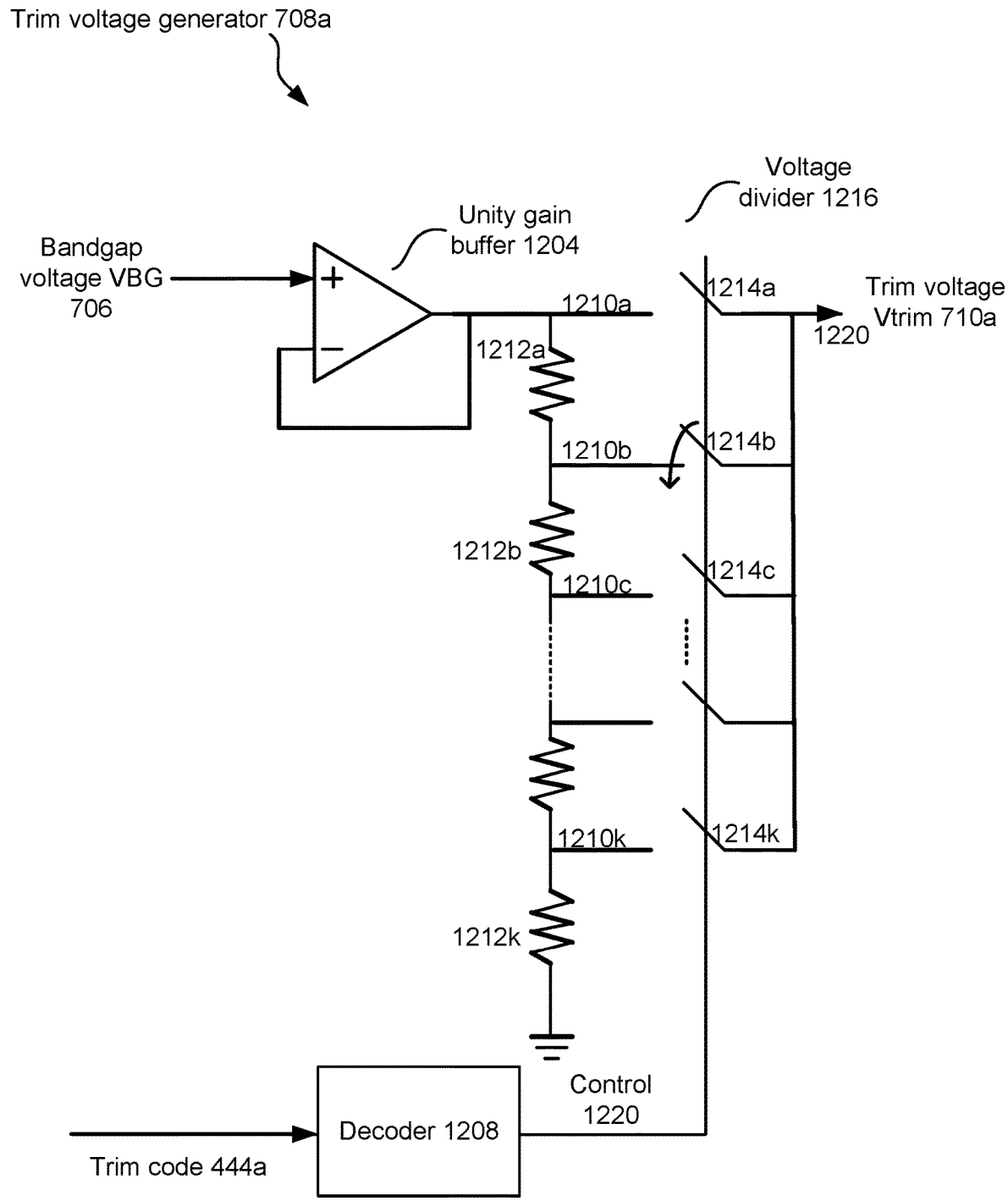
FIG. 12 illustrates an example implementation of a trim voltage generator generating a plurality of trim voltages for a temperature sensor.

FIG. 12 illustrates an example implementation of a trim voltage generator (such as the trim voltage generator 708a) of the temperature sensor 400 of FIG. 7. The trim voltage generator 708a comprises a buffer 1204, such as an operational amplifier configured as a unity gain buffer, that receives the bandgap voltage VBG 706. An output of the buffer 1204 is provided to a first end node of a voltage divider 1216, a second end node of which is coupled to a ground terminal. Resistors 1212a, 1212b, . . . , 1212k are coupled between the two end nodes of the voltage divider 1216, where each intermediate node between two consecutive resistors provides a corresponding voltage output 1210. Thus, the voltage divider 1216 provides a plurality of voltage outputs 1210a, 1210b, . . . , 1210k, each of which is coupled via a corresponding switch 1214 to an output node 1220 providing the trim voltage Vtrim 710a. For example, a first voltage output 1210a is coupled via a switch 1214a to the output node 1210, a second voltage output 1210b is coupled via a switch 1214b to the output node 1210, and so on. A decoder 1208 receives the trim code 444a, and controls operation of the switches 1214a, . . . , 1214k. Operation of the trim voltage generator 708a is discussed in further detail herein with respect to a method 1300 of FIG. 13A.

Figure 13A:
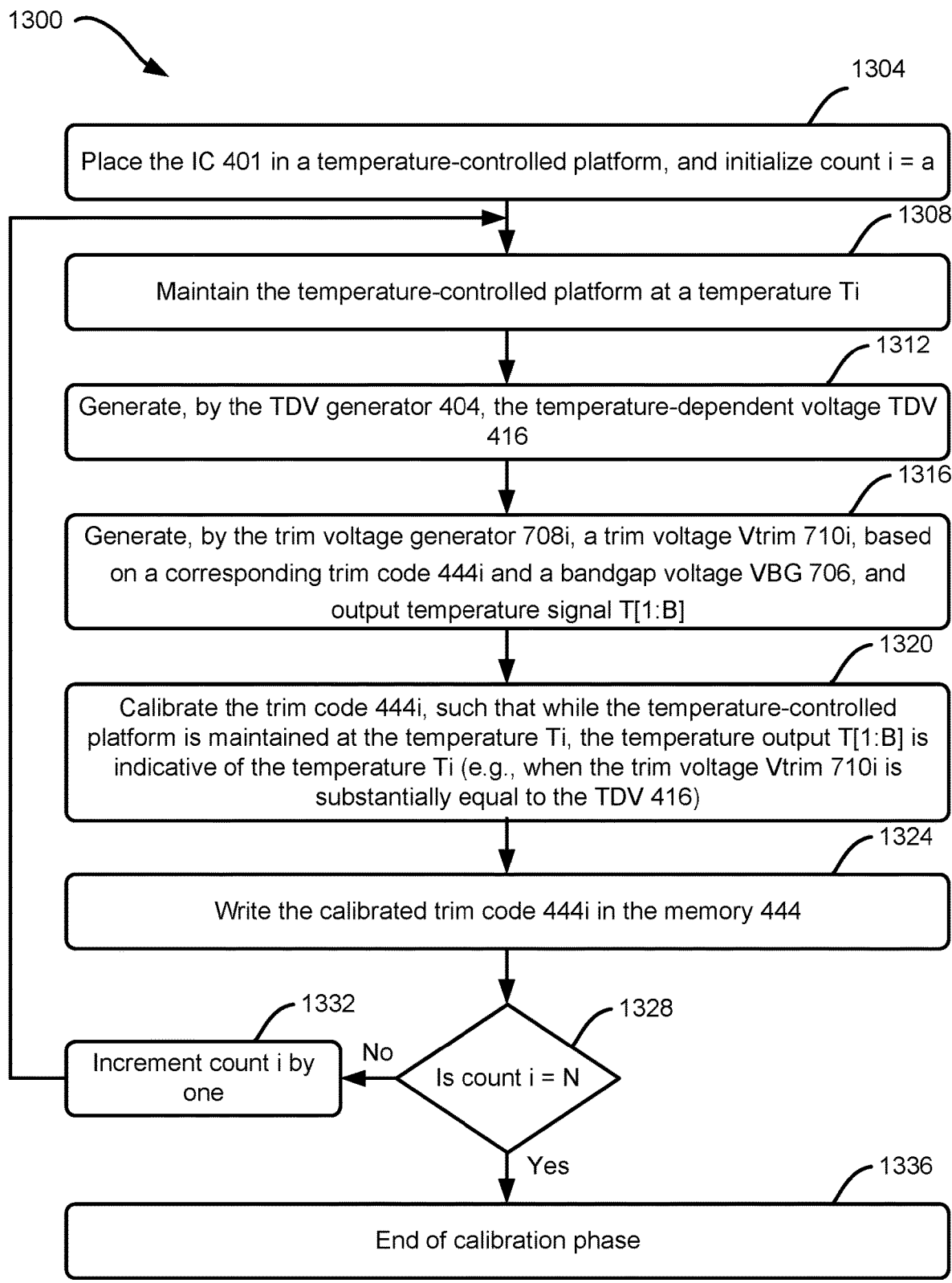
FIG. 13A illustrates an example method for manufacturing an IC, and calibrating a temperature sensor within the IC.

FIG. 13A illustrates an example method 1300 for manufacturing the IC 401 of FIG. 4, and calibrating the temperature sensor 400 within the IC 401. The method 1300 comprises, at 1304, placing the IC 401 in a temperature-controlled platform, and initializing a count i to be "a". Thus, during a first iteration of the method 1300, the trim voltage generator 708a of the temperature sensor 400 will be calibrated. Any appropriate temperature-controlled platform can be used, which can maintain specific temperatures for calibrating the IC 401.

In an embodiment, only a single IC is loaded in the temperature-controlled platform for calibration. In another embodiment, a batch of ICs (such as ICs belonging to a same wafer) are loaded in the temperature-controlled platform for calibration. Although a batch of ICs can be loaded in the temperature-controlled platform for calibration, each IC is calibrated individually and independent of other ICs, such that the calibration accounts for process variations that can possibly occur across various ICs, even ICs that are manufactured at the same time using the same process.

At 1308, the temperature-controlled platform is maintained at a temperature Ti corresponding to the count i. In an example, the temperature-controlled platform along with the IC 401 is maintained at this temperature Ti, such that internal components of the IC 401 (such as the TDV generator 404) also reaches and is maintained at this temperature. Note that as the count i is initialized to "a," the platform is maintained at the temperature Ta of FIG. 5, which may also correspond to the temperature T(a,1) of FIGS. 8A and 10B.

At 1312, the TDV generator 404 generates the temperature-dependent voltage TDV 416, while the temperature is maintained at temperature Ti. At 1316, the trim voltage generator 708i generates a trim voltage Vtrim 710i, based on a corresponding trim code 444i and the bandgap voltage VBG 706. For example, referring to FIG. 12, during the first iteration of the method 1300, the trim voltage generator 708a generates the trim voltage Vtrim 710a, based on the corresponding trim code 444a and the bandgap voltage VBG 706. The temperature determination circuit 428 outputs temperature signal T[1:B] that is indicative of the temperature.

At 1320, the trim code 444i is calibrated, such that while the temperature-controlled platform is maintained at the temperature Ti, the temperature signal T[1:B] indicates the temperature to be Ti. This happens when the trim voltage Vtrim 710i is substantially equal to the TDV 416. For example, during the first iteration of the method 1300 (e.g., when i=a), the temperature signal T[1:B] and/or the COMP 424a (e.g., generated by the circuit of either 11A or 11B) are monitored. The monitoring can be performed by a calibration system that may be, in an example, external to the IC 401, although the calibration system may be internal to the IC 401 in another example. In an example, the calibration system monitors the temperature signal T[1:B], which is based on the COMP 424a (as well as the other COMP signals). In another example, the calibration system directly monitors the COMP 424a. Note that the COMP 424a is generated based on a comparison of the trim voltage Vtrim 710a (which is equal to the Vref 416a) and the TDV 412, as discussed with respect to FIGS. 11A and 11B. The trim code 444a is then calibrated (e.g., by the calibration system). For example, the trim code 444a is adjusted, e.g., incrementally changed, to correspondingly increase the trim voltage Vtrim 710a, until the COMP 424a changes it's state from a bit 0 to bit 1. Just when the COMP 424a changes its state, the temperature signal T[1:B] indicates the temperature to be the platform temperature Ti. This occurs when the trim voltage Vtrim 710a is substantially equal to the TDV 416. Thus, the calibration system monitors the temperature signal T[1:B], and just when the temperature signal T[1:B] indicates the temperature to be Ti, the calibration reads the corresponding trim code 444a as the calibrated trim code.

At 1324, the calibrated trim code 444i is written in the memory 440. At 1328, a check is performed to determine whether the count i =N (e.g., to check whether all the trim voltage generator 708a, . . . , 708N have been calibrated). If "No" at 1328 (e.g., count i is less than N), the count i is incremented by one at 1332. For example, the count i is incremented from a to b after the first iteration, is incremented from b to c after the second iteration, and so on, until the count reaches the total number of trim voltage generators N. Thus, for example, during the second iteration of the method 1300, the trim voltage generator 708b is calibrated, and so on. Once all the trim voltage generators have been calibrated, the count i is equal to N at 1328. Accordingly, the decision box 1328 outputs an "Yes" and the calibration phase ends at 1328 of the method 1300. The operational phase of the temperature sensor 400 has been discussed with respect to FIGS. 4-12 and also discussed herein below with respect to method 1360 of FIG. 13B.

Figure 13B:
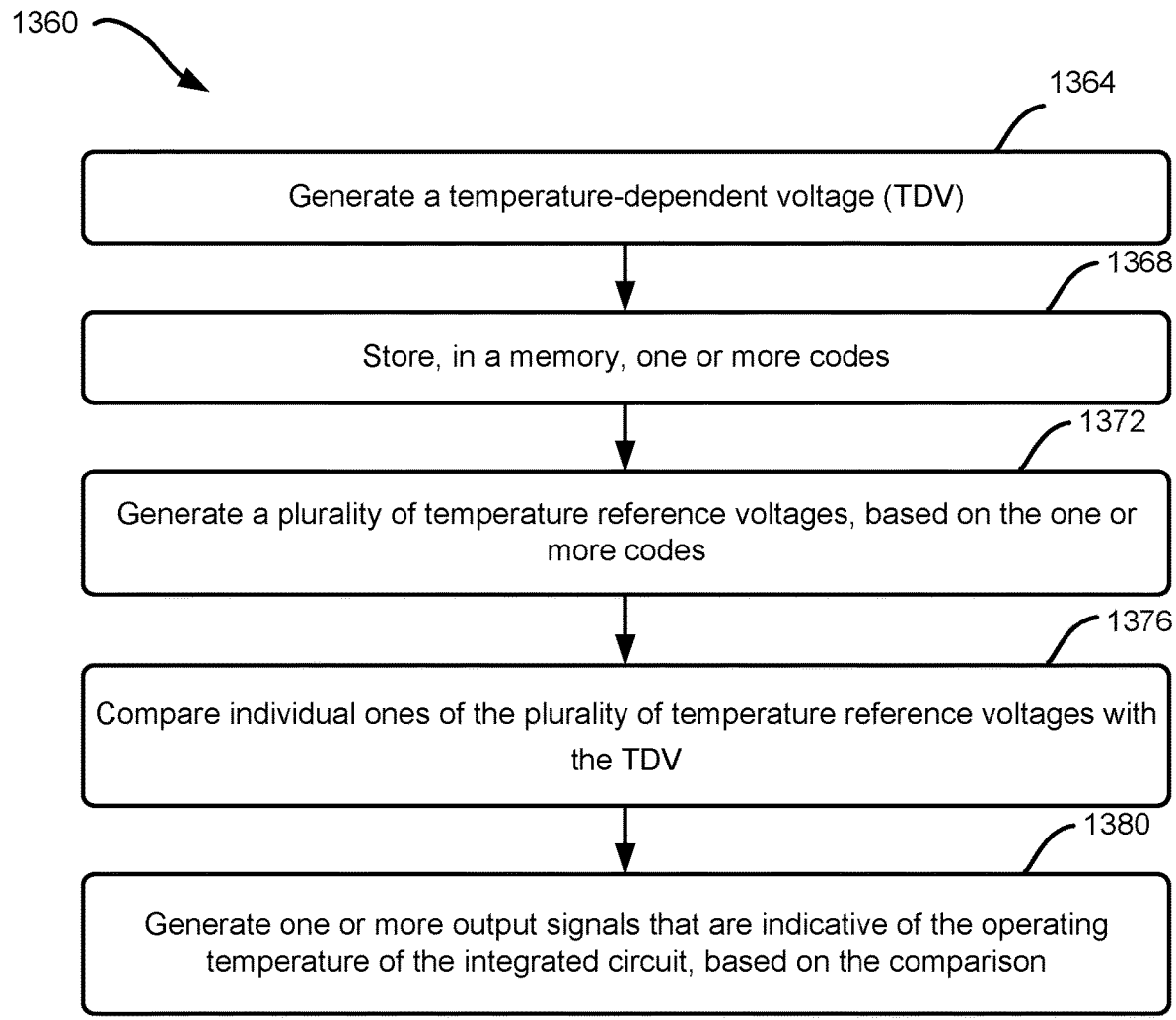
FIG. 13B illustrates an example method for operating a temperature sensor within an IC.

FIG. 13B illustrates an example method 1360 for operating the temperature sensor 400 within the IC 401. The method 1360 comprises, at 1364, generating (e.g., by the TDV generator 404) the temperature-dependent voltage TDV 416. The generated value of the TDV 416 is based on the current operating temperature of the IC 401.

At 1368, one or more codes (such as the calibrated trim code 444i, calibration of which was discussed with respect to the method 1300 of FIG. 13A) are stored in a memory, such as the memory 444.

At 1372, a plurality of temperature reference voltages is generated, based on the one or more codes. Examples of the temperature reference voltages include voltages Vref 416a, 416b, . . . , 416M, as discussed with respect to FIGS. 4, 7, 9, and 10A.

At 1376, individual ones of the plurality of temperature reference voltages are compared with the TDV. For example, the comparator circuit 420 (see FIGS. 4, 11A, 11B) compares individual ones of the plurality of temperature reference voltages with the TDV. Examples of the comparator circuit have been discussed with respect to FIGS. 11A and 11B. A plurality of comparison signals is generated, such as COMP 424a, 424b, . . . , 424M, as discussed with respect to FIGS. 4, 11A, and 11B.

At 1380, one or more output signals are generated, based on the comparison, where the output signals are indicative of the operating temperature of the integrated circuit. For example, FIG. 4 illustrates the temperature determination circuit 428 receiving the COMP 424, and generating a temperature signal T 432 indicative of the operating temperature.

Figure 14:
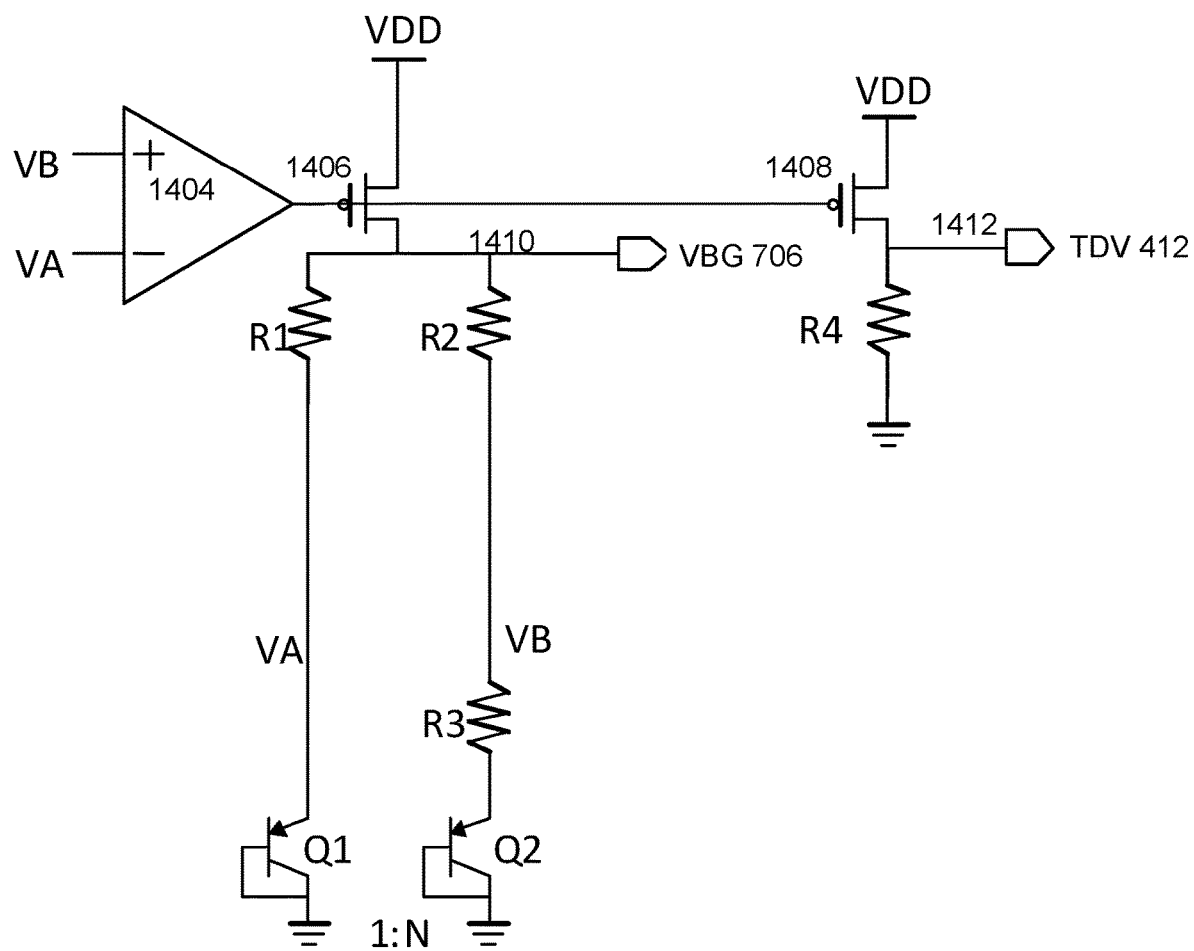
FIG. 14 is a circuit diagram of a circuit that generates a TDV and a bandgap voltage VBG.

FIG. 14 is a circuit diagram of a circuit that generates the TDV 412 and the bandgap voltage VBG 706. Thus, the circuit of FIG. 14 is a combination of the TDV generator 404 of FIG. 4 and the bandgap voltage generator 704 of FIG. 7. An operation amplifier 1404 of the circuit of FIG. 14 receives voltages VA and VB, and outputs a signal that is used to control transistors 1406 and 1408, which are, for example, Metal-Oxide-Semiconductor Field-Effect Transistors (MOSFET). The transistor 1406 is coupled between a supply voltage VDD and a first output node 1410, where the first output node 1410 generates the bandgap voltage VBG 706. The output node 1410 is coupled to a ground terminal via a resistor R1 and a transistor Q1. The output node 1410 is also coupled to the ground via resistors R2 and R3, and a transistor Q2. In an embodiment, the transistors Q1 and Q2 are Bipolar Junction Transistors (BJT). Each of the transistors Q1 and Q2 are in a diode-connected transistor configuration, where a corresponding base and a corresponding collector of a transistor are coupled. The transistor 1408 is coupled between the supply voltage VDD and a second output node 1412, which outputs the TDV 412. The output node 1412 is grounded via resistor R4. The generated bandgap voltage VBG 706 is a fixed or constant voltage, regardless of power supply variations, temperature changes and circuit loading from a device, whereas the TDV 412 varies based on the temperature, as discussed herein earlier. FIG. 14 illustrates a mere example of the TDV generator 404 and the bandgap voltage generator 704, and any variation and/or a different implementation of either of these circuits is possible.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a first circuit to generate a temperature-dependent voltage (TDV) that varies in response to a variation in an operating temperature of the integrated circuit;
a memory to store one or more codes;
a second circuit to generate a plurality of temperature reference voltages, based on the one or more codes, wherein each temperature reference voltage, of the plurality of temperature reference voltages, corresponds to a value of the TDV at a given temperature; and
one or more comparator circuits to compare individual ones of the plurality of temperature reference voltages with the TDV, to generate one or more output signals that are indicative of the operating temperature of the integrated circuit,
wherein the second circuit comprises:
a voltage generator circuit to receive a bandgap voltage and a first code of the one or more codes and generate a trim voltage; and
a voltage divider to receive the trim voltage and generate the plurality of temperature reference voltages.

2. The integrated circuit of claim 1, wherein the voltage generator circuit is a first voltage generator circuit, the trim voltage is a first trim voltage, and wherein the second circuit further comprises:
a second voltage generator circuit to receive the bandgap voltage and a second code of the one or more codes, and generate a second trim voltage,
wherein the voltage divider is to receive the first trim voltage and the second trim voltage, and generate the plurality of temperature reference voltages based on the first trim voltage and the second trim voltage.

3. The integrated circuit of claim 2, wherein the voltage divider comprises:
a first node to receive the first trim voltage;
a second node to receive the second trim voltage; and
at least a first resistor and a second resistor coupled between the first and second nodes, wherein a third node is between the first resistor and the second resistor,
wherein a first temperature reference voltage of the plurality of temperature reference voltages is generated at the first node, a second temperature reference voltage of the plurality of temperature reference voltages is generated at the second node, and a third temperature reference voltage of the plurality of temperature reference voltages is generated at the third node.

4. The integrated circuit of claim 3, in which a variation of the TDV with temperature, within a temperature range defined by first and second temperatures, is approximated as being linear.

5. The integrated circuit of claim 3, wherein:
the first temperature reference voltage is compared to the TDV, to detect a first operating temperature of the integrated circuit;
the second temperature reference voltage is compared to the TDV, to detect a second operating temperature of the integrated circuit; and
the third temperature reference voltage is compared to the TDV, to detect a third operating temperature of the integrated circuit, the third operating temperature between the first and second temperatures.

6. The integrated circuit of claim 1, wherein the second circuit comprises:
a second voltage generator circuit to receive the bandgap voltage and a second code of the one or more codes, and generate a second trim voltage;
a third voltage generator circuit to receive the bandgap voltage and a third code of the one or more codes, and generate a third trim voltage; and
a second voltage divider,
wherein a first end node of the voltage divider is to receive the trim voltage,
wherein a second end node of the voltage divider and a first end node of the second voltage divider are to receive the second trim voltage,
wherein a second end node of the second voltage divider is to receive the third trim voltage,
wherein the voltage divider is to output (i) the trim voltage as a first temperature reference voltage of the plurality of temperature reference voltages, (ii) the second trim voltage as a second temperature reference voltage of the plurality of temperature reference voltages, and (iii) a third temperature reference voltage of the plurality of temperature reference voltages, the third temperature reference voltage within a voltage range defined by the trim voltage and second trim voltage, and
wherein the second voltage divider is to output (i) the third trim voltage as a fourth temperature reference voltage of the plurality of temperature reference voltages, and (ii) a fifth temperature reference voltage of the plurality of temperature reference voltages, the fifth temperature reference voltage within a voltage range defined by the second and third trim voltages.

7. The integrated circuit of claim 1, wherein the one or more comparator circuits comprises:
a plurality of comparator circuits, wherein each comparator circuit of the plurality of comparator circuits is to compare a corresponding one of the plurality of temperature reference voltages with the TDV.

8. The integrated circuit of claim 1, wherein the one or more comparator circuits comprises:
a comparator circuit that is to compare a first reference voltage of the plurality of temperature reference voltages with the TDV, and then compare a second reference voltage of the plurality of temperature reference voltages with the TDV.

9. The integrated circuit of claim 1, further comprising:
a third circuit to receive outputs of the one or more comparator circuits, and generate a temperature signal based on the outputs of the one or more comparator circuits.

10. The integrated circuit of claim 1, wherein:
the memory is a first memory that comprises one or more registers; and
the integrated circuit further comprises:
a second memory; and
a third circuit to generate an operating voltage for the second memory, based at least in part on the indication of the operating temperature of the integrated circuit.

11. The integrated circuit of claim 1, further comprising:
a bandgap voltage generator to generate a bandgap voltage,
wherein the second circuit is to generate the plurality of temperature reference voltages, based on the bandgap voltage.

12. The integrated circuit of claim 1, wherein the TDV has a positive temperature coefficient within an operating temperature range of the integrated circuit, and wherein the plurality of temperature reference voltages are temperature independent within the operating temperature range of the integrated circuit.

13. An integrated circuit, comprising:
a first voltage generator to generate a first voltage that varies with temperature;
a reference voltage generator circuit to generate a plurality of temperature reference voltages which are temperature independent within an operating temperature range of the integrated circuit, the plurality of temperature reference voltages being generated responsive to a bandgap reference voltage;
a comparator circuit to compare the plurality of temperature reference voltages to the first voltage; and
logic responsive to the comparator circuit to generate a digital signal indicating temperature.

14. The integrated circuit of claim 13, further comprising:
a memory array; and
one or more circuits to generate one or more operating voltages for the memory array, based at least in part on the digital signal.

15. A method comprising:
generating, by a first circuit, a temperature-dependent voltage (TDV) that varies in response to a variation in an operating temperature of an integrated circuit;
storing, in a memory, one or more codes;
generating, by a second circuit, a plurality of temperature reference voltages, based on the one or more codes, wherein each temperature reference voltage, of the plurality of temperature reference voltages, corresponds to a value of the TDV at a given temperature; and
comparing individual ones of the plurality of temperature reference voltages with the TDV, to generate one or more output signals that are indicative of the operating temperature of the integrated circuit,
wherein the generating of the plurality of temperature reference voltages includes:
a voltage generator circuit, of the second circuit, receiving a bandgap voltage and a first code of the one or more codes and generating a trim voltage; and
a voltage divider, of the second circuit, receiving the trim voltage and generating the plurality of temperature reference voltages.

16. The method of claim 15, wherein the trim voltage is a first trim voltage, and
wherein generating the plurality of temperature reference voltages comprises:
generating a second trim voltage, based on the bandgap voltage and a second code of the one or more codes;
receiving, by a voltage divider, the first trim voltage and the second trim voltage; and
outputting, by the voltage divider, the plurality of temperature reference voltages based on the first trim voltage and the second trim voltage.

17. The method of claim 15, wherein comparing individual ones of the plurality of temperature reference voltages with the TDV comprises:
comparing a first temperature reference voltage of the plurality of temperature reference voltages with the TDV, to detect a first operating temperature of the integrated circuit;
comparing a second temperature reference voltage of the plurality of temperature reference voltages with the TDV, to detect a second operating temperature of the integrated circuit; and
comparing a third temperature reference voltage of the plurality of temperature reference voltages with the TDV, to detect a third operating temperature of the integrated circuit.

* * * * *